United States Patent
Hayashi et al.

(10) Patent No.: US 8,723,414 B2
(45) Date of Patent: May 13, 2014

(54) ORGANIC ELECTROLUMINESCENCE DEVICE, METHOD OF MANUFACTURING ORGANIC ELECTROLUMINESCENCE DEVICE, DISPLAY APPARATUS AND ILLUMINATION APPARATUS

(75) Inventors: Naoyuki Hayashi, Kanagawa (JP); Tomotake Ikada, Kanagawa (JP); Masayuki Mishima, Minami-Ashigara (JP)

(73) Assignee: UDC Ireland Limited, Dublin (IE)

( * ) Notice: Subject to any disclaimer, the term of this patent is extended or adjusted under 35 U.S.C. 154(b) by 685 days.

(21) Appl. No.: 12/873,546

(22) Filed: Sep. 1, 2010

(65) Prior Publication Data

US 2011/0049498 A1   Mar. 3, 2011

(30) Foreign Application Priority Data

Sep. 1, 2009 (JP) .................................. 2009-202088
May 25, 2010 (JP) .................................. 2010-119741

(51) Int. Cl.
*H05B 33/00* (2006.01)

(52) U.S. Cl.
USPC .............. 313/504; 313/506; 445/23; 428/690

(58) Field of Classification Search
USPC ........ 313/504, 506, 512; 428/690; 257/10, 98
See application file for complete search history.

(56) References Cited

U.S. PATENT DOCUMENTS

| 7,204,735 B2 * | 4/2007 | Yamazaki et al. ............... 445/24 |
| 7,420,208 B2 * | 9/2008 | Yamazaki et al. ............... 257/59 |
| 2008/0272691 A1 * | 11/2008 | Chen et al. ..................... 313/504 |
| 2009/0253916 A1 * | 10/2009 | Kawakami et al. ........... 548/446 |

FOREIGN PATENT DOCUMENTS

| JP | 3541294 B2 | 7/2004 |
| JP | 2007-048732 A | 2/2007 |
| JP | 2009-152435 A | 7/2009 |

* cited by examiner

*Primary Examiner* — Joseph L Williams
(74) *Attorney, Agent, or Firm* — Morgan, Lewis & Bockius LLP

(57) ABSTRACT

An organic electroluminescence device, having a pair of electrodes, and an organic layer containing multiple light emitting layers provided between a pair of electrodes, wherein at least one of the multiple light emitting layers is formed by coating a liquid containing ingredients to constitute the layer in a state of solution or dispersion in an organic solvent through the use of a spraying method.

13 Claims, 1 Drawing Sheet

ORGANIC ELECTROLUMINESCENCE DEVICE, METHOD OF MANUFACTURING ORGANIC ELECTROLUMINESCENCE DEVICE, DISPLAY APPARATUS AND ILLUMINATION APPARATUS

CROSS-REFERENCE TO RELATED APPLICATION(S)

The present application claims priority from Japanese Patent Application Nos. 2009-202088 filed on Sep. 1, 2009 and 2010-119741 filed on May 25, 2010, the entire content of which is incorporated herein by reference.

BACKGROUND

1. Field

The present invention relates to an organic electroluminescence device, a method of manufacturing an organic electroluminescence device, a display apparatus and an illumination apparatus.

2. Description of the Related Art

Research into organic-material utilized devices, such as organic electroluminescence devices (hereinafter referred to as organic EL devices too) and organic-semiconductor utilized transistors, has been actively conducted. As to the organic EL devices in particular, it has been expected to develop them for use in large-area and full-color display devices of solid-state light emission type or for illumination use as low-priced large-area surface light sources. In general an organic electroluminescence device is made up of organic layers, including a light emitting layer, and a pair of electrodes between which the organic layers are sandwiched. When a voltage is applied to such an organic electroluminescence device, electrons from the negative electrode and holes from the positive electrode are injected into the light emitting layer. These electrons and holes are recombined in the light emitting layer, and luminescence is produced by energy's being emitted in the form of light at the time of recovery of the energy level from the conduction band to the valence band.

In view of luminous efficiency and lifetime of an organic EL device, the light emitting layer of an organic EL device is usually obtained through film formation by vapor deposition of ingredients to constitute such a light emitting layer. Organic electroluminescence devices of a type that vapor deposition is utilized in the making thereof (hereinafter referred to as deposition-type organic EL devices too) have been in practical uses as light emitting sources for displays of cellular phones, television sets and the like.

In recent years, however, further reduction in manufacturing costs of organic electroluminescence devices has been required in both the case of using them for display devices and the case of using them for illumination apparatus.

For instance, the organic electroluminescence devices that are made by using organic solvents in which ingredients to constitute light emitting layers are dissolved or dispersed and coating them (which are also referred to as coating-type organic EL devices hereinafter) are announced in U.S. Pat. No. 7,453,200 and JP Patent 3541294. Although the vapor deposition method in the manufacturing of deposition-type organic EL devices is great in installation cost of vapor-deposition apparatus and energy cost at the time of vapor deposition of ingredients, these costs can be omitted in the manufacturing of coating-type organic EL devices, and besides, the coating-type organic EL devices have an advantage that it is easy to manufacture large-screen organic EL displays also.

The coating-type organic EL devices disclosed in U.S. Pat. No. 7,453,200 and JP Patent 3541294, however, have problems that, because each of their light emitting layers is formed of a single layer, they are insufficient in luminous efficiency, durability and color reproducibility when two or more kinds of light emitting materials are incorporated into each of their light emitting layers for the purpose of obtaining a desired color of light emission (e.g. white-light emission in view of the use in illumination apparatus).

On the other hand, JP-A-2009-152435 discloses the organic EL device having multiple light emitting layers, and therein examples of the device whose light emitting layers each are formed by use of a spin coating method are disclosed. However, the coating in accordance with a spin coating method tends to cause damage to the underlying layer, and hence the organic EL device occasionally underwent deterioration in luminous efficiency and durability.

In addition, JP-A-2007-48732 also discloses the organic EL device having multiple light emitting layers, and therein an example of the illumination apparatus having the organic EL devices whose multiple light emitting layers each are formed in accordance with an inkjet method is disclosed. In this organic EL device, each light emitting layer is cured through the use of azobis(isobutyronitrile) as a polymerization catalyst, and thereby multilayer coating is fulfilled. According to such a method, however, the residue structure of the polymerization catalyst is left in each light emitting layer, which caused a problem of exacerbating EL properties, especially durability of the device.

SUMMARY

An objective of the invention is to solve the traditional problems and to attain the followings.

More specifically, the invention aims to provide an organic electroluminescence device which excels in luminous efficiency, durability and color reproducibility, is low in drive voltage and allows reduction in manufacturing cost.

In addition, the invention aims to provide a manufacturing method by which it becomes possible to manufacture organic electroluminescence devices excellent in luminous efficiency, durability and color reproducibility and low in drive voltage at low manufacturing costs.

Further, the invention aims to provide a display apparatus and an illumination apparatus which each are equipped with the organic electroluminescence device as specified above.

To be more specific, means to solution of the problems are as follows.

[1]

An organic electroluminescence device, having: a pair of electrodes; and an organic layer containing multiple light emitting layers provided between the pair of electrodes, wherein at least one of the multiple light emitting layers is formed by coating a liquid containing ingredients to constitute the layer in a state of solution or dispersion in an organic solvent through the use of a spraying method.

[2]

The organic electroluminescence device according to [1], wherein each of the multiple light emitting layers is formed by coating the liquid through the use of a spraying method.

[3]

The organic electroluminescence device according to [1], further having a hole transporting layer.

[4]

The organic electroluminescence device according to [1], further having an electron transporting layer.

[5]
The organic electroluminescence device according to [1], wherein each of the layers other than the light emitting layer formed through the use of the spraying method is formed by coating a liquid containing ingredients to constitute the layer in a state of solution or dispersion in an organic solvent.

[6]
The organic electroluminescence device according to [1], wherein each of the layers other than the light emitting layer formed by the spraying method is formed by coating a liquid containing ingredients to constitute the layer in a state of solution or dispersion in an organic solvent through the use of a spraying method.

[7]
The organic electroluminescence device according to [1], wherein the multiple light emitting layers include a first light emitting layer which emits light of a first emission color and a second light emitting layer which emits light of a second emission color different from the first emission color.

[8]
The organic electroluminescence device according to [1], wherein the multiple light emitting layers include a first light emitting layer which emits light of a first emission color, a second light emitting layer which emits light of a second emission color different from the first emission color and a third light emitting layer which emits light of a third emission color different from the first emission color and the second emission color.

[9]
The organic electroluminescence device according to [1], wherein the multiple light emitting layers contain different light emitting materials, respectively.

[10]
The organic electroluminescence device according to [1], wherein at least one of the multiple light emitting layers contains a phosphorescent material.

[11]
The organic electroluminescence device according to [1], which can emit white light.

[12]
A method for manufacturing an organic electroluminescence device which has an organic layer having a pair of electrodes, and multiple light emitting layers between a pair of electrodes, wherein at least one of the multiple light emitting layers is formed by coating a liquid containing ingredients to constitute the layer in a state of solution or dispersion in an organic solvent through the use of a spraying method.

[13]
The method of manufacturing the organic electroluminescence device according to [12], wherein each of the multiple light emitting layers is coated by coating the liquid through the use of a spraying method.

[14]
The method of manufacturing the organic electroluminescence device according to [13], wherein the organic solvents of the liquids used in forming the multiple light emitting layers, respectively, are one and the same organic solvent.

[15]
A display apparatus which is equipped with the organic electroluminescence device according to any one of [1] to [11] or the organic electroluminescence device obtained by the method of manufacturing an organic electroluminescence device according any one of [12] to [14].

[16]
An illumination apparatus which is equipped with the organic electroluminescence device according to any one of [1] to [11] or the organic electroluminescence devices obtained by the method of manufacturing an organic electroluminescence device according to any one of [12] to [14].

According to the invention, it is possible to provide an organic electroluminescence device which excels in luminous efficiency, durability and color reproducibility, is low in drive voltage and allows reduction in manufacturing cost.

According to the invention, it is also possible to provide a manufacturing method by which organic electroluminescence devices excellent in luminous efficiency, durability and color reproducibility and low in drive voltage can be manufactured at low manufacturing costs.

According to the invention, it is further possible to provide a display apparatus and an illumination apparatus which each are equipped with the organic electroluminescence devices as specified above.

DETAILED DESCRIPTION OF EXEMPLARY EMBODIMENTS

Organic EL devices relating to embodiments of the invention are described below in detail.

Each of the present organic EL devices is an organic EL device having a pair of electrodes and an organic layer including multiple light emitting layers between a pair of electrodes, and at least one of the multiple light emitting layers is a layer which is formed from a liquid containing ingredients to constitute such a layer in a state of solution or dispersion in an organic solvent through the use of a spray coating method.

According to such configuration, at least one of the multiple light emitting layers is formed from a liquid containing ingredients to constitute said layer in a state of solution or dispersion in an organic solvent through the use of a spraying method, and therefore there is no need to adopt a vapor deposition method in formation of such a light emitting layer, and the cost of manufacturing organic EL devices can be reduced.

Additionally, when the underlying layer of a light emitting layer formed through the use of a spraying method in particular is an organic layer different from such the light emitting layer, adoption of the spraying method in formation of at least one of the multiple light emitting layers allows the surface of the underlying layer (e.g. another light emitting layer, a hole transporting layer or an electron transporting layer) to be dissolved subtly in the organic solvent of the liquid in a condition of more certainly weakening a fear that the different organic layer is damaged from the organic solvent of the liquid through an unintended degree of dissolution and so on. Thus better bonding in a condition of no damage to the underlying layer is made at the interface between the light emitting layer and the underlying layer as compared with cases where the light emitting layer is formed in a vapor deposition method or a coating method other than the spraying method, and the organic EL device obtained can therefore have excellent luminous efficiency and durability and can achieve reduction in drive voltage.

Further, because each of the present organic EL devices has multiple light emitting layers, two or more different kinds of light emitting materials prepared for obtaining a desired color of light emission can be incorporated into two or more different light emitting layers, respectively, without incorporating them into one and the same light emitting layer. Thus the present organic EL devices each avoid two or more different kinds of light emitting materials from being incorporated into one and the same layer, and thereby can prevent those materials from adversely affecting one another and causing deterioration in their individual performance capabilities. It is therefore thought that the present organic EL devices can have improvements in not only color reproducibility but also luminous efficiency and durability.

Figure 1:
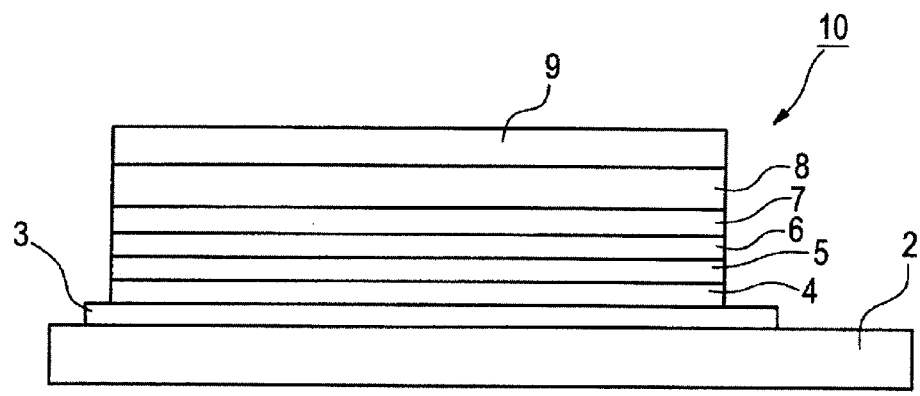
FIG. 1 is a schematic diagram showing one example of the layer structure of an organic EL device relating to the invention

FIG. 1 illustrates one example of the structure of an organic EL device relating to the invention. The organic EL device 10 illustrated in FIG. 1 which relates to an embodiment of the invention has on a supporting substrate 2 an organic layer sandwiched between an anode 3 and a cathode 9. Herein, the organic layer includes e.g. a hole transporting layer 4, a first light emitting layer 5, a second light emitting layer 6, a third light emitting layer 7 and an electron transporting layer 8, and these layers are laminated on top of each other in the order of mention. In the organic EL device 10, at least one of the first light emitting layer 5, the second light emitting layer 6 and the third light emitting layer 7 is formed by coating a liquid containing ingredients to constitute such a layer in a state of solution or dispersion in an organic solvent through the use of a spraying method. The first light emitting layer 5, the second light emitting layer 6 and the third light emitting layer 7 are designed to emit light of different emission colors, namely light of a first emission color, light of a second emission color and light of a third emission color, respectively, through e.g. incorporation of constituent materials (e.g. light emitting materials) different from one another into different light emitting layers. Therefore it becomes possible to make an organic EL device capable of emitting white light by designing the light emitting layers so that each of the first, second and third emission colors is chosen as one of the three primary colors of light, namely red, green and blue colors.

Alternatively, the organic EL device 10 may be designed so that the first light emitting layer 5 and the third light emitting layer 7 emit light of the same emission color and the second light emitting layer 6 emits light of a different emission color.

On the other hand, the organic EL device may be structured to have two light emitting layers by omitting the third light emitting layer 7 from the organic EL device 10. By structuring the organic EL device in such a way, it is possible to make the organic EL device capable of emitting light of magenta color when the device is designed to choose the first and second emission colors between red and blue colors on a one-by-one basis, the organic EL device capable of emitting light of yellow color when the device is designed to choose the emission colors between red and green colors on a one-by-one basis, and the organic EL device capable of emitting light of cyan color when the device is designed to choose the emission colors between blue and green colors on a one-by-one basis.

In addition, it is also possible to make the organic EL device capable of emitting white light when the device is designed to choose the first and second emission colors between blue and orange colors on a one-by-one basis.

The organic solvent in the liquid has no particular restriction so long as constituent materials of the layer concerned are soluble or dispersible therein, and examples thereof include halogen-containing solvents (such as chloroform, carbon tetrachloride, dichloromethane, 1,2-dichloroethane and chlorobenzene), ketone solvents (such as acetone, methyl ethyl ketone, diethyl ketone, n-propyl methyl ketone and cyclohexanone), aromatic solvents (such as benzene, toluene and xylene), ester solvents (such as ethyl acetate, n-propyl acetate, n-butyl acetate, methyl propionate, ethyl propionate, γ-butyrolactone and diethyl carbonate), ether solvents (such as tetrahydrofuran and dioxane), amide solvents (such as dimethylformamide and dimethylacetamide), and dimethyl sulfoxide.

The solids content of the liquid, though not particularly limited, is generally from 0.0001 mass % to 10 mass %, preferably from 0.0001 mass % to 1 mass %, based on the total amount of the liquid.

Additionally, the process of coating a liquid in accordance with a spraying method is, in other words, a process of forming a layer by spraying an aerosol prepared by suspending liquid particles in gas (carrier gas) on a given surface and coating the given surface with the aerosol. The aerosol has no particular restriction as to its form, but the size of liquid particles is generally from 0.01 μm to 100 μm, preferably from 0.01 μm to 10 μm. Examples of gas usable for the aerosol include air, nitrogen, argon and helium.

The sprayer adopted in the spraying method may be any of known ones.

The carrier gas speed of the aerosol is preferably from 0.1 L/min to 100 L/min, far preferably from 0.1 L/min to 10 L/min.

The spraying time of the aerosol is determined according to an intended thickness of each layer, and not particularly restricted.

The layer formed by using a spraying method is preferably dried over a set period of time after the completion of layer formation by the spraying method, especially in the case of providing another layer thereon. Although the drying method to be adopted depends on the kind of an organic solvent used, it is preferable that the drying temperature is in a range from 20° C. to 150° C. and the drying time is in a range from 1 minute to 10 hours. And the way of drying may be vacuum drying or be atmospheric drying.

It is far preferred that each of the multiple light emitting layers (the first light emitting layer 5, the second light emitting layer 6 and the third light emitting layer 7 in the organic EL device 10) be formed by coating the liquid through the use of a spraying method. By coating in such a way the total cost of forming all the light emitting layers can be reduced, what's more the bonding at the interface between adjacent layers becomes better since each light emitting layer dissolves the surface of its underlying layer to a subtle extent, and therefore the thus obtained organic EL device can have more excellent luminous efficiency and durability and further reduction in drive voltage.

In the organic layer, layers other than at least one light emitting layer formed in accordance with the spraying method may be formed through the use of any method, and examples of a method which can be adopted therein include dry methods such as a vacuum deposition method, and coating methods such as spin coating, air-knife coating, bar coating, blade coating, slide coating, curtain coating, spray coating, cast coating, dip coating and inkjet coating. The kind of an organic solvent and solids content in a liquid which is used for such a coating method and prepared by dissolving or dispersing ingredients to constitute each layer in an organic solvent are the same as those specified in the description of the spraying method.

For instance, in the case of forming the organic layer of the organic EL device 10 shown in FIG. 1 on the anode 3 by laminating a hole transporting layer 4, a first light emitting layer 5, a second light emitting layer 6, a third light emitting layer 7 and an electron transporting layer 8 on top of each other in the order of mention, any of the dry methods including a vacuum deposition method or any of the coating methods as recited above can be suitably applied to formation of the hole transporting layer 4 since the underlying layer of the hole transporting layer 4 is the anode, and besides, as mentioned hereinafter, materials highly resistant to nonaqueous solvents can be usually adopted as materials for anode use.

To organic layers other than at least one light emitting layer formed through the use of the spraying method, however, coating methods are preferably applied. By applying coating methods, the organic EL device can be made at low cost without adoption of a dry method such as a deposition method which entails high cost.

It is particularly preferable that each of organic layers other than at least one light emitting layer formed by using the spraying method is formed by using a liquid which contains ingredients to constitute such a layer in a state of solution or dispersion in an organic solvent and coating the liquid in accordance with the spraying method. In the organic EL device 10, for instance, it is preferable to adopt the spraying method for forming each of the hole transporting layer 4, the first light emitting layer 5, the second light emitting layer 6, the third light emitting layer 7 and the electron transporting layer 8, and such preference allows unification of methods for coating those layers, resulting in further reduction of manufacturing costs. In addition, when each of organic layers is formed, the organic solvent in which ingredients for each layer are dissolved or dispersed can dissolve the surface of another organic layer as the underlying layer without damaging to the underlying layer, and therefore the bonding at the interface between each light emitting layer and its underlying layer becomes better as compared with cases where each light emitting layer is formed in a deposition method or a coating method other than the spraying method. Thus an organic EL device which excels in luminous efficiency and durability and allows reduction in drive voltage is obtained.

Additionally, when each of the multiple light emitting layers is formed, it is preferable to use the same organic solvent in each of the liquids and, by use of the same organic solvent, the bonding at the interface between each pair of adjacent layers becomes better. Thus it becomes especially easy to obtain an organic EL device excellent in luminous efficiency and durability.

Further, as in the organic EL device 10, it is far preferred that the organic layer include the hole transporting layer 4 formed by coating a liquid which contains ingredients to constitute such a layer in a state of solution or dispersion in an organic solvent. In this way, holes can be more smoothly transported to the light emitting layer, and a high-performance organic EL device can be obtained.

In addition, as in the organic EL device 10, it is far preferred that the organic layer include the electron transporting layer 8 formed by coating a liquid which contains ingredients to constitute such a layer in a state of solution or dispersion in an organic solvent. In this way, electrons can be more smoothly transported to the light emitting layer, and a high-performance organic EL device can be obtained.

The layer structure of the organic layer, though described by reference to FIG. 1, is not particularly restricted, but can be chosen appropriately according to what use and purpose the organic EL device is made for.

In addition, the organic layer is not particularly restricted as to its shape, size and thickness, but can be chosen appropriately according to its purposes.

Examples of a layer structure the present organic EL devices each can have are given below, but these layer structures should not be construed as limiting the scope of the invention. For instance, an organic EL device relating to an embodiment of the invention may have 4 or more light emitting layers in order to obtain desired colors.

(1) Anode/hole transporting layer/first light emitting layer/second light emitting layer/electron transporting layer/cathode (2) Anode/hole transporting layer/first light emitting layer/second light emitting layer/blocking layer/electron transporting layer/cathode (3) Anode/hole transporting layer/first light emitting layer/second light emitting layer/blocking layer/electron transporting layer/electron injection layer/cathode (4) Anode/hole injection layer/hole transporting layer/first light emitting layer/second light emitting layer/blocking layer/electron transporting layer/cathode (5) Anode/hole injection layer/hole transporting layer/first light emitting layer/second light emitting layer/blocking layer/electron transporting layer/electron injection layer/cathode (6) Anode/hole transporting layer/first light emitting layer/second light emitting layer/third light emitting layer/electron transporting layer/cathode (7) Anode/hole transporting layer/first light emitting layer/second light emitting layer/third light emitting layer/blocking layer/electron transporting layer/cathode (8) Anode/hole transporting layer/first light emitting layer/second light emitting layer/third light emitting layer/blocking layer/electron transporting layer/electron injection layer/cathode (9) Anode/hole injection layer/hole transporting layer/first light emitting layer/second light emitting layer/third light emitting layer/blocking layer/electron transporting layer/cathode

(10) Anode/hole injection layer/hole transporting layer/first light emitting layer/second light emitting layer/third light emitting layer/blocking layer/electron transporting layer/electron injection layer/cathode In the invention, as described above, at least one of multiple light emitting layers included in the organic layer is formed by coating a liquid which contains ingredients to constitute such a layer in a state of solution or dispersion in an organic solvent through the use of a spraying method. Therefore cases where layers other than at least one light emitting layer specified above (e.g. other light emitting layers, a hole transporting layer, a hole injection layer, a blocking layer, an electron transporting layer and an electron injection layer) are formed in accordance with methods other than the spray coating method (e.g. a vapor deposition method) are also within the scope of the invention.

Additionally, an organic EL device relating to an embodiment of the invention may have between each pair of adjacent light emitting layers a different layer included in the organic layer, and this different layer has no particular restriction as to the method for its formation. However, such a different layer is preferably formed according to a coating method, and thereby an organic EL device can be made at low cost without adopting a dry method such as a deposition method which entails high cost. And it is far preferred that the spraying method be adopted for formation of such a different layer. By adoption of the spraying method, the organic solvent in which ingredients for the different layer are dissolved or dispersed can dissolve the surface of a light emitting layer as the underlying layer without damaging to the light emitting layer, and therefore the bonding at the interface between the layers becomes better. Thus an organic EL device having excellent luminous efficiency and durability and allowing reduction in drive voltage can be obtained.

The organic layer has no particular restrictions, and it may include a hole injection layer, a hole transporting layer, an electron injection layer, a hole blocking layer, an electron blocking layer, an exciton blocking layer and so on in addition to light emitting layers. Each of these layers may combine its basic function with another function.

The invention relates also to a method of manufacturing an organic electroluminescence device which has an organic layer including multiple light emitting layers between a pair of electrodes, characterized in that at least one of the multiple light emitting layers is formed by coating a liquid containing ingredients to constitute such a layer in a state of solution or dispersion in an organic solvent through the use of a spraying method.

In the manufacturing method according to the invention, it is far preferred that, as mentioned above, each of the multiple light emitting layers be formed by coating the liquid in accordance with the spraying method. In addition, in formation of each of the multiple light emitting layers, it is preferable that organic solvents used in the different liquids are the same.

Next the components in the present organic EL devices each are described in detail.

(Substrate)

The substrate used in the invention is preferably a substrate which causes neither scattering nor damping of light emitted from organic compound layers. Examples of such the substrate include inorganic materials such as yttrium stabilized by zirconia (YSZ) and glass, and organic materials such as polyesters, including polyethylene terephthalate, polybutylene phthalate and polyethylene naphthalate, polystyrene, polycarbonate, polyether sulfone, polyallylate, polyimide, polycycloolefin, norbornene resin and poly(chlorotrifluoroethylene).

As to the material properties in the case of using e.g. glass as the substrate, it is preferable to use alkali-free glass for the purpose of lessening ions eluted from the glass. When soda lime glass is, however, used, it is preferable to use the glass on which a barrier coat of silica or the like is put. In another case of using an organic material as the substrate, it is preferable that the organic material used excels in heat resistance, dimensional stability, electrical insulation and machinability.

The substrate has no particular restrictions as to the shape, structure, size and so on, but can be chosen appropriately according to the use and purpose of a luminescence device to be made. In general the substrate is preferably shaped like a plate. As to the structure, the substrate may have a single-layer structure or it may have a multilayer structure, and it may be formed of a single structural member or it may be formed of two or more structural members.

The substrate may be in a colorless-and-transparent state or it may be in a colored-and-transparent state. In view of causing neither scattering nor damping of light beams emitted from the organic light emitting layers, however, it is preferable that the substrate is colorless and transparent.

It is possible for the substrate to have a moisture permeation control layer (gas barrier layer) on the front or back surface thereof. As a material of the moisture permeation control layer (gas barrier layer), an inorganic compound such as silicon nitride or silicon oxide can be used to advantage. And the moisture permeation control layer (gas barrier layer) can be formed e.g. by using a high-frequency sputtering method.

In the case of using a thermoplastic substrate, the substrate may further be covered with a hard coating layer, an undercoating layer or the like on an as needed basis.

(Anode)

In general it is essential only that an anode should function as an electrode for supplying holes into an organic compound layer, and no particular restriction is imposed on e.g. anode's shape, structure and size. The anode material can therefore be chosen from well-known electrode materials as appropriate according to the use and purpose of a luminescence device to be made. And the anode is usually provided as a transparent anode.

Materials suitable for the anode are e.g. metals, alloys, metal oxides, conductive compounds and mixtures of two or more of these substances. Specific examples of an anode material include inorganic conductive substances such as conductive metal oxides, including antimony-doped tin oxide (ATO), fluorine-doped tin oxide (FTO), tin oxide, zinc oxide, indium oxide, indium tin oxide (ITO) and indium zinc oxide (IZO), metals including gold, silver, chromium and nickel, mixtures or laminates of these metals and conductive metal oxides, copper iodide and copper sulfide, organic conductive materials such as polyaniline, polythiophene and polypyrrole, and laminates of ITO and these organic conductive materials. Of these anode materials, conductive metal oxides are preferable to the others, and ITO is especially preferred in terms of productivity, high conductivity, transparency and so on.

The anode can be formed on the substrate according to a method selected appropriately from wet systems such as a printing system and a coating system, physical systems such as a vacuum deposition method, a sputtering method and an ion plating method, or chemical systems such as CVD and plasma CVD methods with consideration given to an anode-forming-material's suitability. In the case of selecting ITO as the anode material, for instance, the anode can be formed according to a direct-current or high-frequency sputtering method, a vacuum deposition method, an ion plating method or so on.

The present organic EL devices each have no particular restriction as to the position to form the anode, and can choose the position appropriately according to the use and purpose thereof. However, it is preferable that the anode is formed on the substrate. In this case, the anode may be formed throughout one surface of the substrate or it may be formed partially on one surface of the substrate.

Patterning at the time of anode formation may be performed by chemical etching which utilizes photolithography or the like or it may be performed by physical etching which utilizes laser or the like. Alternatively, the patterning may be performed by vacuum deposition, sputtering or the like via a mask or it may be performed in a lift-off process or a print process.

The anode thickness can be chosen appropriately according to a material which forms the anode, and cannot be defined in a wholesome manner. However, the anode thickness is generally of the order of 10 nm to 50 μm, preferably from 50 nm to 20 μm.

The resistance value of the anode is preferably $10^3$ Ω/sq. or below, far preferably $10^2$ Ω/sq. or below. When the anode is transparent, the transparent anode may be colorless or colored. In order to collect light emissions from the side of the transparent anode, its transmittance is preferably 60% or above, far preferably 70% or above.

Detailed descriptions of transparent anodes can be found e.g. in *Tomei Denkyoku no Shin-Tenkai*, compiled under the supervision by Yutaka SAWADA and published in 1999 by CMC Publishing Co., Ltd., and the particulars described therein can be applied to the invention. When a plastic substrate low in heat resistance is used, it is preferred that the transparent anode be formed by making ITO or IZO into film at a low temperature of 150° C. or below.

(Cathode)

In general it is essential only that a cathode should function as an electrode for injection electrons into an organic compound layer, and no particular restriction is imposed on e.g. cathode's shape, structure and size. The cathode material can therefore be chosen from well-known electrode materials as appropriate according to the use and purpose of a luminescence device to be made.

Materials which can constitute the cathode are e.g. metals, alloys, metal oxides, electrically conductive compounds, and mixtures of these substances. Examples of such substances include alkali metals (e.g. Li, Na, K, Cs), alkaline earth metals (e.g. Mg, Ca), gold, silver, lead, aluminum, sodium-potassium alloy, lithium-aluminum alloy, magnesium-silver alloy, indium, and rare earth metals such as ytterbium. Although these substances may be used alone, combinations of two or more of these substances can be used to advantage from the viewpoint of ensuring compatibility between stability and electron injection capability.

Of these substances, alkali metals and alkaline earth metals are suitable as cathode constituting materials in point of electron injection capability, while aluminum-dominated materials are suitable in point of storage stability. The term "aluminum-dominated material" as used herein is intended to include aluminum itself, aluminum alloys containing 0.01 mass % to 10 mass % of alkali metals or alkaline earth metals (e.g. lithium-aluminum alloy, magnesium-aluminum alloy), and mixtures thereof.

Additionally, cathode materials are detailed in JP-A-2-15595 and JP-A-5-121172, and the materials disclosed in these official gazettes can be applied in the invention also.

The method of forming the cathode is not particularly restricted, but known methods can be applied thereto. For instance, the cathode can be formed according to a method selected appropriately from wet systems such as a printing system and a coating system, physical systems such as a sputtering method and an ion plating method, or chemical systems such as CVD and plasma CVD methods with consideration given to a cathode-forming-material's suitability. In the case of selecting e.g. metal or the like as the cathode material, the cathode can be formed by subjecting one or more than one kind of metal to simultaneous or sequential sputtering or the like.

Patterning at the time of cathode formation may be performed by chemical etching which utilizes photolithography or the like or it may be performed by physical etching which utilizes laser or the like. Alternatively, the patterning may be performed by vacuum deposition, sputtering or the like via a mask or it may be performed in a lift-off process or a print process.

In the invention, there is no particular restriction as to the position to form the cathode, and the cathode may be formed on the whole surface of an organic compound layer or it may be formed on part of the organic compound layer's surface.

In addition, a dielectric layer formed e.g. with fluoride or oxide of an alkali metal or an alkaline earth metal may be inserted in a thickness of 0.1 nm to 5 nm between the cathode and the organic compound layer. Such a dielectric layer can also be regarded as a kind of electron injection layer. And the dielectric layer can be formed e.g. by a vacuum deposition method, a sputtering method, an ion plating method or the like.

The cathode thickness can be chosen appropriately according to materials which constitute the cathode, and cannot be defined in a wholesome manner. However, the cathode thickness is generally of the order of 10 nm to 5 µm, preferably from 50 nm to 1 µm. In addition, the cathode may be transparent or it may be opaque. When the cathode is a transparent cathode, it is possible to form the transparent cathode by forming a cathode material into a thin film having a thickness of 1 nm to 10 nm and further covering the thin film with a transparent conductive material such as ITO or IZO.

(Organic Layer)

The organic layer in the invention is described below. The organic layer in each of the present organic EL devices includes multiple light emitting layers. Of the layers included in the organic layer, the layers other than the light emitting layers are, as mentioned above, a hole transporting layer, an electron transporting layer, a blocking layer, a hole injection layer, an electron injection layer and so on.

(Light Emitting Layers)

Each organic light-emitting layer is a layer which has a function of receiving holes from an anode, a hole injection layer or a hole transporting layer and electrons from a cathode, an electron injection layer or an electron transporting layer when an electric filed is applied thereto and providing the holes and the electrons with a place for their recombination, thereby producing luminescence.

Each of the light emitting layers in the invention is a thin film containing an amorphous organic semiconductor.

Each light emitting layer, though it may be constituted of a light emitting material alone, is preferably made up as a layer of the mixture of a host material and a light emitting material (also referred to as a light emitting dopant).

The light emitting material, though it may be a fluorescent material or it may be a phosphorescent material, is preferably a phosphorescent material.

The host material is preferably a charge transporting material. The host material may be one type of host material or it may be a mixture of two or more types of host materials. For instance, the host material may be made up of a mixture of an electron transporting host material and a hole transporting host material. Further, the light emitting layer may contain a material of the kind which neither has a charge transporting property nor emits light.

Each light emitting layer can contain two or more types of light emitting materials for the purpose of improving color purity of the light emitted or extending the wavelength region of the light emitted.

<<Phosphorescent Material>>

In general the phosphorescent material can be a complex containing a transition metal atom or a lanthanoide-series atom.

Such a transition metal atom has no particular restriction, but suitable examples thereof include ruthenium, rhodium, palladium, tungsten, rhenium, osmium, iridium, gold, silver, copper and platinum. Of these metals, rhenium, iridium and platinum are preferable to the others, and iridium and platinum are far preferred.

Examples of the lanthanoide-series atom include lanthanum, cerium, praseodymium, neodymium, samarium, europium, gadolinium, terbium, dysprosium, holmium, erbium, thulium, ytterbium and lutecium. Of these lanthanoide-series atoms, neodymium, europium and gadolinium are preferable to the others.

Examples of a ligand in such a complex include the ligands described e.g. in G. Wilkinson, *Comprehensive Coordination Chemistry*, published by Pergamon Press in 1987, H. Yersin, *Photochemistry and Photophysics of Coordination Compounds*, published by Springer-Verlag in 1987, and YAMAMOTO Akio, *Yuki Kinzoku Kagaku—Kiso to Oyo—*, published by Shokabo Publishing Co., Ltd. in 1982.

Suitable examples of the ligands include halogeno ligands (preferably a chloro ligand), aromatic carbon ring ligands (which each preferably contain 5 to 30 carbon atoms, far preferably contain 6 to 30 carbon atoms or further preferably contain 6 to 20 carbon atoms, particularly preferably contain 6 to 12 carbon atoms, including as examples a cyclopentadienyl anion, a benzene anion and a naphthyl anion), nitrogen-containing hetero ring ligands (which each preferably contain 5 to 30 carbon atoms, far preferably contain 6 to 30 carbon atoms, further preferably contain 6 to 20 carbon atoms or particularly preferably contain 6 to 12 carbon atoms, including as examples phenylpyridine, benzoquinoline, quinolinol, bipyridyl and phenanthroline), diketone ligands (e.g. acetylacetone), carboxylic acid ligands (which each preferably contain 2 to 30 carbon atoms, far preferably contain 2 to 20 carbon atoms or further preferably contain 2 to 16 carbon atoms, including as an example an acetato ligand), alcholato ligands (which each preferably contain 1 to 30 carbon atoms, far preferably contain 1 to 20 carbon atoms or further preferably contain 6 to 20 carbon atoms, including as an example a phenolato ligand), silyloxy ligands (which each contain preferably 3 to 40 carbon atoms, far preferably contain 3 to 30 carbon atoms or further preferably contain 3 to 20 carbon atoms, including as examples a trimethylsilyloxy ligand, a dimethyl-tert-butylsilyloxy ligand and a triphenylsilyloxy ligand), a carbonyl ligand, an isonitrile ligand, a cyano ligand, phosphido ligands (which each preferably contain 3 to 40 carbon atoms, far preferably contain 3 to 30 carbon atoms, further preferably contain 3 to 20 carbon atoms or particularly preferably contain 6 to 20 carbon atoms, including as an example a triphenylphosphine ligand), thiolato ligands (which each preferably contain 1 to 30 carbon atoms, far preferably contain 1 to 20 carbon atoms or further preferably contain 6 to 20 carbon atoms, including as an example a phenylthiolato ligand), and phosphine oxido ligands (which each preferably contain 3 to 30 carbon atoms, far preferably contain 8 to 30 carbon atoms or further preferably contain 18 to 30 carbon atoms, including as an example a triphenylphosphine oxido ligand). Of these ligands, nitrogen-containing hetero ring ligands are preferable to the others.

The complexes as recited above may have one transition metal atom per compound or they may be the so-called polynuclear complexes having two or more transition metal atoms per compound. Different kinds of metal atoms may be contained simultaneously.

Of such complexes, examples of those suitable as light emitting materials include the phosphorescence producing compounds disclosed e.g. in U.S. Pat. No. 6,303,238B1, U.S. Pat. No. 6,097,147, WO 00/57676, WO 00/70655, WO 01/08230, WO 01/39234A2, WO 01/41512A1, WO 02/02714A2, WO 02/15645A1, WO 02/44189A1, WO 05/19373A2, JP-A-2001-247859, JP-A-2002-302671, JP-A-2002-117978, JP-A-2003-133074, JP-A-2002-235076, JP-A-2003-123982, JP-A-2002-170684, EP 1211257, JP-A-2002-226495, JP-A-2002-234894, JP-A-2001-247859, JP-A-2001-298470, JP-A-2002-173674, JP-A-2002-203678, JP-A-2002-203679, JP-A-2004-357791, JP-A-2006-256999, JP-A-2007-19462, JP-A-2007-84635 and JP-A-2007-96259. Examples of luminescent dopants which are far preferred among those compounds include the Ir complexes, the Pt complexes, the Cu complexes, the Re complexes, the W complexes, the Rh complexes, the Ru complexes, the Pd complexes, the Os complexes, the Eu complexes, the Tb complexes, the Gd complexes, the Dy complexes and the Ce complexes. Of these complexes, Ir complexes, the Pt complexes and the Re complexes are particularly preferable, notably Ir complexes, the Pt complexes and the Re complexes each having at least one kind of coordination bond selected from metal-carbon, metal-nitrogen, metal-oxygen and metal-sulfur coordinate bonds. In terms of luminous efficiency, durability under driving, chromaticity and so on, the Ir complexes, the Pt complexes and the Re complexes each having a polydentate ligand, including a tridentate ligand or higher, are preferred over the others.

<<Fluorescent Material>>

The fluorescent materials generally include benzoxazole, benzimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bisstyrylanthracene, quinacridone, pyrrolopyridine, thiadiazolopyridine, cyclopentadiene, styrylamine, aromatic dimethylidyne compounds, condensed polycyclic aromatic compounds (e.g. anthracene, phenanthroline, pyrene, perylene, rubrene, pentacene), various kinds of metal complexes typified by complexes of 8-quinolinol, pyrromethene complexes and rare-earth metal complexes, polymeric compounds such as polythiophene, polyphenylene and polyphenylenevinylene, organic silanes, and derivatives of the compounds recited above.

Concrete examples of such light emitting materials include the compounds illustrated in JP-A-2009-16579, paragraphs [0054] to [0064], the compounds illustrated in JP-A-2008-218972, paragraphs [0059] to [0068], and those used in Examples described hereinafter, namely FirPic, Ir(ppy)$_3$, Btp$_2$Ir(acac) and light emitting materials 1 to 3. Selection of light emitting materials is made according to the intended color of light emission, and therefore light emitting materials usable in the invention should not be construed as being limited to the above-cited ones.

The light emitting materials are generally incorporated into a light emitting layer in a proportion from 0.1 mass % to 50 mass % based on the total mass of all compounds forming the light emitting layer. In terms of durability and external quantum efficiency, it is appropriate that the light emitting materials be incorporated in a proportion from 1 mass % to 50 mass %, preferably from 2 mass % to 40 mass %.

The suitable thickness of each light emitting layer is not particularly limited, but it is generally from 2 nm to 500 nm. In point of external quantum efficiency, the thickness is preferably from 3 nm to 200 nm, far preferably from 5 nm to 100 nm, particularly preferably from 10 nm to 50 nm.

<Host Material>

The host materials usable in the invention include hole-transportable host materials having excellent hole transportability (which may be described as hole-transportable hosts) and electron-transportable host materials having excellent electron transportability (which may be described as electron-transportable hosts).

<<Hole-Transportable Host>>

As to the hole-transportable hosts usable in the invention, the following materials can be given as concrete examples.

More specifically, the examples include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), aniline copolymers, thiophene oligomers, oligomers of conductive polymers like polythiophene, organic silanes, carbon film, and derivatives of the compounds recited above.

Of these compounds, preferred ones are indole derivatives, carbazole derivatives, aromatic tertiary amine compounds and thiophene derivatives, and far preferred ones are compounds having carbazolyl groups in their individual molecules.

<<Electron-Transportable Host>>

From the viewpoints of improving durability and lowering drive voltage, the electron affinity Ea of the electron-transportable hosts in the light emitting layers for use in the invention is preferably from 2.5 eV to 3.5 eV, far preferably from 2.6 eV to 3.4 eV, further preferably from 2.8 eV to 3.3 eV. In addition, from the same viewpoints of improving durability and lowering drive voltage, their ionization potential Ip is preferably from 5.7 eV to 7.5 eV, far preferably from 5.8 eV to 7.0 eV, further preferably from 5.9 eV to 6.5 eV.

To be concrete, such electron-transportable hosts include e.g. the following materials.

More specifically, examples thereof include pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorelenylidenemethane, distyrylpyrazine, fluorinated aromatic compounds, tetracarboxylic acid anhydrides of heterocyclic rings such as naphthalene perylene, phthalocyanine, and derivatives of the compounds recited above (which may condensed with other rings), and further include various kinds of metal complexes, typified by metal complexes of 8-quinolinol derivatives, metallo-phthalocyanines and metal complexes containing benzoxazole or benzothiazole as their respective ligands.

The electron-transportable hosts are preferably metal complexes, azole derivatives (such as benzimidazole derivatives and imidazopyridine derivatives) or azine derivatives (such as pyridine derivatives, pyrimidine derivatives and triazine derivatives). Among these materials, the invention particular prefers metal complexes in point of durability. What are far preferred as metal complex compounds (A) are metal complexes each containing at least one ligand which coordinates the metal via its nitrogen atom, oxygen atom or sulfur atom.

The metal complexes have no particular restrictions as to their metal ions, but the metal ion in each individual complex is preferably a beryllium ion, a magnesium ion, an aluminum ion, a gallium ion, a zinc ion, an indium ion, a tin ion, a platinum ion or a palladium ion, far preferably a beryllium ion, an aluminum ion, a gallium ion, a zinc ion, a platinum ion or a palladium ion, further preferably an aluminum ion, a zinc ion or a palladium ion.

The ligands contained in the metal complexes may be any of already known various ligands, and examples thereof include the ligands described e.g. in H. Yersin, *Photochemistry and Photophysics of Coordination Compounds*, published by Springer-Verlag in 1987, and YAMAMOTO Akio, *Yuki Kinzoku Kagaku—Kiso to Oyo—*, published by Shokabo Publishing Co., Ltd. in 1982.

The ligands are preferably nitrogen-containing heterocyclic ring ligands (which each preferably contain 1 to 30 carbon atoms, far preferably contain 2 to 20 carbon atoms or particularly preferably contain 3 to 15 carbon atoms, and may be a monodentate ligand or may be a bidentate or higher ligand). What are preferred as these ligands are from bidentate to hexadentate ligands. In addition, a mixture of a monodentate ligand with any of bidentate to hexadentate ligands is also preferred.

Suitable examples of such ligands include azine ligands (such as a pyridine ligand, a bipyridyl ligand and a terpyridine ligand), hydroxyphenylazole ligands (such as a hydroxyphenylbenzimidazole ligand, a hydroxyphenylbenzoxazole ligand, a hydroxyphenylimidazole ligand and a hydroxyphenylimidazopyridine ligand), alkoxy ligands (which each preferably contain 1 to 30 carbon atoms, far preferably contain 1 to 20 carbon atoms or particularly preferably 1 to 10 carbon atoms, with examples including methoxy, ethoxy, butoxy and 2-ethylhexyloxy), aryloxy ligands (which each preferably contain 6 to 30 carbon atoms, far preferably contain 6 to 20 carbon atoms or particularly preferably 6 to 12 carbon atoms, with examples including phenoxy, 1-naphthoxy, 2-naphthoxy, 2,4,6-trimethylphenoxy and 4-biphenyloxy), heteroaryloxy ligands (which each preferably contain 1 to 30 carbon atoms, far preferably contain 1 to 20 carbon atoms or particularly preferably 1 to 12 carbon atoms, with examples including pyridyloxy, pyrazinyloxy, pyrimidyloxy and quinolyloxy), alkylthiolato ligands (which each preferably contain 1 to 30 carbon atoms, far preferably contain 1 to 20 carbon atoms or particularly preferably 1 to 12 carbon atoms, with examples including methylthiolato and ethylthiolato), arylthio ligands (which each preferably contain 6 to 30 carbon atoms, far preferably contain 6 to 20 carbon atoms or particularly preferably 6 to 12 carbon atoms, including phenylthio as an example), heteroarylthio ligands (which each preferably contain 1 to 30 carbon atoms, far preferably contain 1 to 20 carbon atoms or particularly preferably 1 to 12 carbon atoms, with examples including pyridylthio, 2-benzimizolylthio, 2-benzoxazolylthio and 2-benzothiazolylthio), siloxy ligands (which each preferably contain 1 to 30 carbon atoms, far preferably contain 3 to 25 carbon atoms or particularly preferably 6 to 20 carbon atoms, with examples including triphenylsiloxy, triethoxysiloxy and triisopropylsiloxy), aromatic hydrocarbon anion ligands (which each preferably contain 6 to 30 carbon atoms, far preferably contain 6 to 25 carbon atoms or particularly preferably 6 to 20 carbon atoms, with examples including a phenyl anion, a naphthyl anion and an anthranyl anion), aromatic heterocyclic ring anion ligands (which each preferably contain 1 to 30 carbon atoms, far preferably contain 2 to 25 carbon atoms or particularly preferably 2 to 20 carbon atoms, with examples including a pyrrole anion, a pyrazole anion, a pyrazole anion, a triazole anion, an oxazole anion, a benzoxazole anion, a thiazole anion, a benzothiazole anion, a thiophene anion and a benzothiophene anion), and indolenine anion ligands. Among these ligands, nitrogen-containing heterocyclic ring ligands, aryloxy ligands, heteroaryloxy ligands, or siloxy ligands are preferred.

Examples of a metal complex electron-transportable host include the compounds disclosed e.g. in JP-A-2002-235076, JP-A-2004-214179, JP-A-2004-221062, JP-A-2004-221065, JP-A-2004-221068 and JP-A-2004-327313.

The host material content in the invention is not particularly limited, but in terms of luminous efficiency and drive voltage, it is preferably from 15 mass % to 95 mass % with respect to the total mass of all compounds forming the light emitting layer.

In addition, the host materials for use in the invention preferably have their glass transition temperatures in a range from 50° C. to 150° C. Their glass transition temperatures are far preferably from 60° C. to 150° C. Their glass transition temperatures lower than 50° C. are undesirable in heat resistance of the devices made, and those higher than 150° C. are also undesirable in difficulty in performing heat treatment after film formation.

Of all the materials recited above, examples of host materials practicably usable in the invention include the compounds illustrated in JP-A-2009-16579, paragraphs [0079] to [0083], and CBP and a host material 1 used in Examples described hereinafter, but these materials should not be construed as limiting the scope of the invention.

(Hole Injection Layer, Hole Transporting Layer)

The hole injection layer and the hole transporting layer are layers having functions of receiving holes from an anode or an anode side and transporting the holes to a cathode side. Hole injection materials and hole transporting materials used in those layers may be low-molecular compounds or they may be high-molecular compounds.

To be concrete, such a layer is preferably a layer containing a pyrrole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne compound, a phthalocyanine compound, a porphyrin compound, a thiophene derivative, an organic silane derivative, carbon or so on.

Of these substances, poly(3,4-ethylenedioxythiophene) poly(styrenesulfonate) (PEDOT:PSS), a hole transporting material 1 and PTPDES (trade name, a product manufactured by CHEMIPRO KASEI KAISHA, LTD.) which are used in Examples described hereinafter can be given as suitable examples.

Into the hole injection layer or the hole transporting layer in the present organic EL devices each, an electron-acceptable dopant can be incorporated. As the electron-acceptable dopant for introduction into the hole injection layer or the hole transporting layer, any inorganic compound or any organic compound can be used as long as it has properties of accepting electrons and oxidizing organic compounds.

Examples of such an inorganic compound include metal halides such as ferric chloride, aluminum chloride, gallium chloride, indium chloride and antimony pentachloride, and metal oxides such as vanadium pentoxide and molybdenum trioxides.

Examples of an organic compound suitably used as such a dopant include compounds having as their substituents a nitro group, halogen, a cyano group, a trifluoromethyl group and like groups, respectively, quinine compounds, acid anhydride compounds, and fullerene.

In addition to these compounds, the compounds disclosed e.g. in JP-A-6-212153, JP-A-11-111463, JP-A-11-251067, JP-A-2000-196140, JP-A-2000-286054, JP-A-2000-315580, JP-A-2001-102175, JP-A-2001-160493, JP-A-2002-252085, JP-A-2002-56985, JP-A-2003-157981, JP-A-2003-217862, JP-A-2003-229278, JP-A-2004-342614, JP-A-2005-72012, JP-A-2005-166637 and JP-A-2005-209643 can also be used suitably.

Of such compounds, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine or fullerene C60 is preferred, hexacyanobutadiene, hexacyanobenzene, tetracyanoethylene, tetracyanoquinodimethane, tetrafluorotetracyanoquinodimethane (F4-TCNQ), p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoqunone or 2,3,5,6-tetracyanopyridine is far preferred, and tetrafluorotetracyanoquinodimethane is particularly preferred.

These electron-acceptable dopants may be used alone or they may be used as combinations of two or more thereof. The amount of an electron-acceptable dopant used, though varies with material type, is preferably from 0.01 mass % to 50 mass %, far preferably from 0.05 mass % to 20 mass %, particularly preferably from 0.1 mass % to 10 mass %, with respect to the hole transporting layer material.

From the viewpoint of lowering the drive voltage, it is preferable that the hole injection layer and the hole transporting layer each have a thickness of 500 nm or below.

The thickness of the hole transporting layer is preferably from 1 nm to 500 nm, far preferably from 5 nm to 200 nm, further preferably from 10 nm to 100 nm. And the thickness of the hole injection layer is preferably from 0.1 nm to 200 nm, far preferably from 0.5 nm to 100 nm, further preferably from 1 nm to 100 nm.

Each of the hole injection layer and the hole transporting layer may have a single-layer structure formed with one or more than one of the materials recited above or it may have a multilayer structure made up of multiple layers having the same composition or different compositions.

(Electron Injection Layer, Electron Transporting Layer)

The electron injection layer and the electron transporting layer are layers having functions of receiving electrons from a cathode or a cathode side and transporting the electrons to an anode side. Electron injection materials and electron transporting materials used in those layers may be low-molecular compounds or they may be high-molecular compounds. To be concrete, such a layer is preferably a layer containing a pyridine derivative, a quinoline derivative, a pyrimidine derivative, a pyrazine derivative, a phthalazine derivative, a phenanthroline derivative, a triazine derivative, a triazole derivative, an oxazole derivative, an oxadiazole derivative, an imidazole derivative, a fluorenone derivative, an anthraquinonedimethane derivative, an anthrone derivative, a diphenylquinone derivative, a thiopyran dioxide derivative, a carbodiimide derivative, a fluorenylidenemethane derivative, a distyrylpyrazine derivative, tetracarboxylic acid anhydride of an aromatic ring such as naphthalene or perylene, a phthalocyanine derivative, any of various metal complexes typified by metal complexes of 8-quinolinol derivatives, metal-phthalocyanine and metal complexes having benzoxazole or benzothiazole as their ligands, and an organic silane derivative typified by silole.

Of these compounds, Alq and an electron transporting material 1 which are used in Examples described hereinafter can be given as suitable examples.

Into the electron injection layer or the electron transporting layer in the present organic EL devices, an electron-donative dopant can be incorporated. For the electron-donative dopant introduced into the electron injection layer or the electron transporting layer, it is only essential to have properties of donating electrons and reducing organic compounds. Suitable examples of such a dopant include an alkali metal such as Li, an alkaline earth metal such as Mg, transition metals including rare earth metals, and a reducing organic compound. Of such metals, metals having work functions not higher than 4.2 eV in particular can be used to advantage, and examples thereof include Li, Na, K, Be, Mg, Ca, Sr, Ba, Y, Cs, La, Sm, Gd and Yb. And examples of such a reducing organic compound include a nitrogen-containing compound, a sulfur-containing compound and a phosphorus-containing compound.

In addition to these materials, the materials disclosed e.g. in JP-A-6-212153, JP-A-2000-196140, JP-A-2003-68485, JP-A-2003-229278 and JP-A-2004-342614 can also be used.

These electron-donative dopants may be used alone or they may be used as combinations of two or more thereof. The amount of an electron-donative dopant used, though it varies with the kind of dorpant material, is preferably from 0.1 mass % to 99 mass %, far preferably from 1.0 mass % to 80 mass %, particularly preferably from 2.0 mass % to 70 mass %, based on the electron transporting layer material.

From the viewpoint of lowering the drive voltage, it is preferable that the electron injection layer and the electron transporting layer each have a thickness of 500 nm or below.

The thickness of the electron transporting layer is preferably from 1 nm to 500 nm, far preferably from 5 nm to 200 nm, further preferably from 10 nm to 100 nm. And the thickness of the electron injection layer is preferably from 0.1 nm to 200 nm, far preferably from 0.2 nm to 100 nm, further preferably from 0.5 nm to 50 nm.

Each of the electron injection layer and the electron transporting layer may have a single-layer structure formed with one or more than one of the materials recited above or it may have a multilayer structure made up of multiple layers having the same composition or different compositions.

(Hole Blocking Layer)

The hole blocking layer is a layer having a function of blocking the holes transported from an anode side to light emitting layers from passing on through to the cathode side. In the invention, the hole blocking layer can be provided as an organic compound layer adjacent to the light emitting layer on the cathode side.

As examples of a compound which forms the hole blocking layer, compounds, e.g. those recited above as electron transporting materials, can be appropriately adopted.

Examples of the compound to form the hole blocking layer include aluminum complexes such as bis(2-methyl-8-quinolinolato)(phenolate)aluminum (abbreviated to Balq), triazole derivatives, and phenanthroline derivatives such as 2,9-dimethyl-4,7-diphenyl-1,10-phenanthroline (abbreviated to BCP).

The thickness of the hole blocking layer is preferably from 1 nm to 500 nm, far preferably from 5 nm to 200 nm, further preferably from 10 nm to 100 nm.

The hole blocking layer may have a single-layer structure formed with one or more than one of the materials recited above or it may have a multilayer structure made up of multiple layers identical or different in composition.

(Electron Blocking Layer)

The electron blocking layer is a layer having a function of blocking the electrons transported from a cathode side to light emitting layers from passing on through to the anode side. In the invention, the electron blocking layer can be provided as an organic compound layer adjacent to the light emitting layer on the anode side.

As examples of an organic compound which forms the electron blocking layer, compounds e.g. those recited above as hole transporting materials, can be appropriately adopted.

The thickness of the electron blocking layer is preferably from 1 nm to 500 nm, far preferably from 5 nm to 200 nm, further preferably from 10 nm to 100 nm.

The electron blocking layer may have a single-layer structure formed with one or more than one of the materials recited above or it may have a multilayer structure made up of two or more layers identical or different in composition.

(Protective Layer)

In the invention, the organic EL device in its entirety may be protected with a protective layer. For materials incorporated into the protective layer, it is only essential to have a function of inhibiting device degradation-accelerating matter, such as moisture and oxygen, from intruding into the device. Examples of such materials include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal nitrides such as $SiN_x$ and $SiN_xO_y$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer prepared by copolymerizing a monomer mixture containing tetrafluoroethylene and at least one comonomer, a fluorine-containing copolymer having cyclic structures in its main chain, a water absorbing substance having a water absorptivity of 1% or above, and a moisture-proof substance having a water absorptivity of 0.1% or below.

The method of forming the protective layer is not particularly restricted, and thereto can be applied any of a vacuum deposition method, a sputtering method, a reactive sputtering method, an MBE (molecular beam epitaxy) method, a cluster ion beam method, a ion plating method, a plasma polymerization (RF-excited ion plating) method, a plasma CVD method, a laser CVD method, a heat CVD method, a gas source CVD method, a coating method, a print process and a transfer process.

(Sealing)

Each of the present organic EL devices may further be sealed in its entirety with a sealing enclosure. In addition, a moisture absorbent or an inert liquid may also be enclosed in the space between the sealing enclosure and the luminescence device. The moisture absorbent used therein has no particular restriction, and examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. And the inert liquid used therein also has no particular restriction, and examples thereof include paraffin, liquid paraffin, fluorine-containing solvents such as perfluoroalkane, perfluoroamine and perfluoroether, chlorine-containing solvents, and silicone oils.

Alternatively, a method of sealing with an inorganic film of $SiO_2$, SiN, $Al_2O_3$ or the like or with a resin seal layer can also be used to advantage.

(Sealing Adhesive)

A sealing adhesive usable in the invention has a function of preventing the entry of moisture or oxygen from edge portions of the device.

<Material>

As a material of the sealing adhesive, the same materials as usable in the resin seal layer can be used. Of such materials, epoxy-based adhesives, especially those of light-cure type or thermo-setting type, are preferred from the viewpoint of moisture resistance.

In addition, it is also preferable that the materials contain fillers as additives.

Suitable examples of a filler added to such a sealant include inorganic materials such as $SiO_2$, SiO (silicon oxide), SiON (silicon oxide nitride) and SiN (silicon nitride). By addition of a filler, the sealant is increased in viscosity and improved in both processing suitability and moisture resistance.

<Formula of Sealing Adhesive>
Polymer Composition, Concentration

There is no particular restriction as to the sealing adhesive, and those recited above are usable. As an example of the epoxy-based adhesive of light cure type, XNR5516 manufactured by Nagase Chemtex Corporation can be given.

Thickness

The thickness of a sealing adhesive coating is preferably from 1 μm to 1 mm Coating a sealing adhesive in a thickness thinner than specified above is undesirable because the sealing adhesive cannot be coated evenly, and coating a sealing adhesive in a thickness thicker than specified above is also undesirable because the moisture entry path becomes broad.

<Sealing Method>

In the invention, a functional device can be obtained by coating the sealing adhesive fed with a dispenser or the like in an arbitrary amount, superposing a second substrate on the sealing adhesive coating, and then curing this coating.

(Driving)

Luminescence of the organic electroluminescence device of the present invention can be obtained by applying a DC (if desired, an AC component may be contained) voltage (generally from 2 to 15 volts) or a DC current between the anode and the cathode.

As for the driving method of the organic electroluminescence device of the present invention, the driving methods described, for example, in JP-A-2-148687, JP-A-6-301355, JP-A-5-29080, JP-A-7-134558, JP-A-8-234685, JP-A-8-241047, Japanese Patent 2784615, and U.S. Pat. Nos. 5,828,429 and 6,023,308 can be applied.

The present organic electroluminescence devices can be heightened in light extraction efficiency by utilizing various publicly-known improvements. For instance, it is possible to improve light extraction efficiency and increase external quantum efficiency by working on the substrate's surface profile (e.g. forming a pattern of microscopic asperities on the substrate's surface), or by controlling refractive indices of the substrate, the ITO layer and the organic layers, or by controlling thicknesses of the substrate, the ITO layer and the organic layers, or so on.

The luminescence device of the present invention may be in a so-called top emission system of collecting light from the anode side.

The present organic EL devices may have resonator structure. For instance, each device has on a transparent substrate a multilayer film mirror made up of a plurality of laminated films that have different refractive indices, a transparent or translucent electrode, a light emitting layer and a metal electrode which are superposed on top of each other. Reflections of light produced in the light emitting layer occur repeatedly between the multilayer film mirror and the metal electrode which function as reflector plates, thereby producing resonance.

In another aspect, the transparent or translucent electrode and the metal electrode function as reflector plates, respectively, on the transparent substrate, and reflections of light produced in the light emitting layer occur repeatedly between the reflector plates, thereby producing resonance.

In order to form a resonance structure, the optical distance determined from effective refractive indices of the two reflector plates, and refractive indices and thicknesses of each layers sandwiched between the two reflector plates are adjusted to have optimum values for achieving the desired resonance wavelength. The calculating formula in the first aspect case is described in JP-A-9-180883, and that in the second aspect case is described in JP-A-2004-127795.

As methods of designing an organic EL display as a display of full-color type, as described e.g. in *Gekkan Display*, the September issue in 2000, pp. 33-37, a three-color luminescence method in which organic EL devices to emit three kinds of light corresponding to chromatic three primary colors (blue (B), green (G) and red (R)), respectively, are disposed on a substrate, a white color method in which white luminescence from an organic EL device designed for production of white luminescence is separated into three primary colors of light through a color filter, a color conversion method in which blue luminescence from an organic EL device designed for production of blue luminescence is converted into red (R) and green (G) by passage through fluorescent dye layers, and so on are known.

In addition, by combined use of a plurality of organic EL devices enabling light emissions of different colors in accordance with the method as mentioned above, a plane-form light source to emit light of a desired color can be obtained. For instance, a white-light emitting light source is obtained by combined use of blue and yellow luminescence devices or by combined use of blue, green and red luminescence devices.

(Applications)

The present organic EL devices and manufacturing methods thereof can find widespread application in various areas including displays of digital still cameras, displays of cell-phone, personal digital assistant (PDA), computer display, information display for cars, TV monitor and general illumination.

(Display Apparatus)

Next a display apparatus relating to an embodiment of the invention is explained by reference to FIG. 2.

Figure 2:
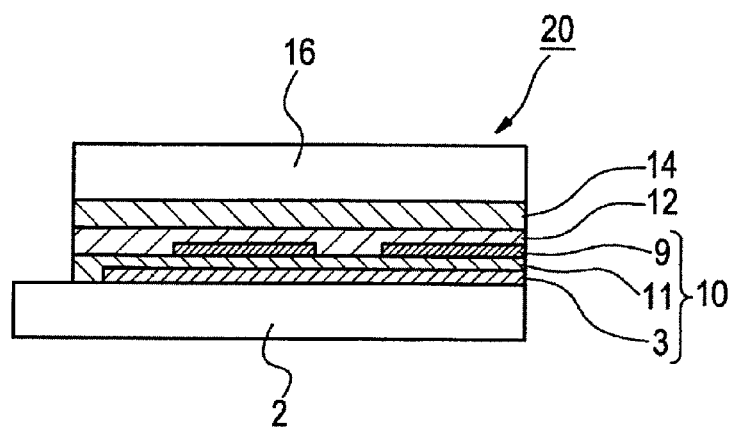
FIG. 2 is a schematic diagram showing one example of a display apparatus relating to the invention

FIG. 2 is a cross-sectional diagram schematically showing one example of the display apparatus relating to an embodiment of the invention.

As shown in FIG. 2, the display apparatus 20 relating to an embodiment of the invention is provided with a transparent substrate 2 (supporting substrate), an organic EL device 10, a sealing enclosure 16 and so on.

The organic EL device 10 is formed by laminating on the substrate 2 an anode 3 (first electrode), an organic layer 11 and a cathode 9 (second electrode) in order of mention. In addition, a protective layer 12 is superposed on the cathode 9, and on the protective layer 12 a sealing enclosure 16 is further provided via an adhesive layer 14. Incidentally, part of each of the electrodes 3 and 9, a diaphragm, an insulating layer and so on are omitted.

Herein, the adhesive layer 14 is preferably a layer formed with the sealing adhesive as described above.

The thus structured display apparatus 20 displays luminescence from the organic EL device 10 in a condition that the surface of the substrate 2 on the side opposite to the anode 3 is made to act as screen.

(Illumination Apparatus)

The illumination apparatus according to an embodiment of the present invention is described below by referring to FIG. 3.

Figure 3:
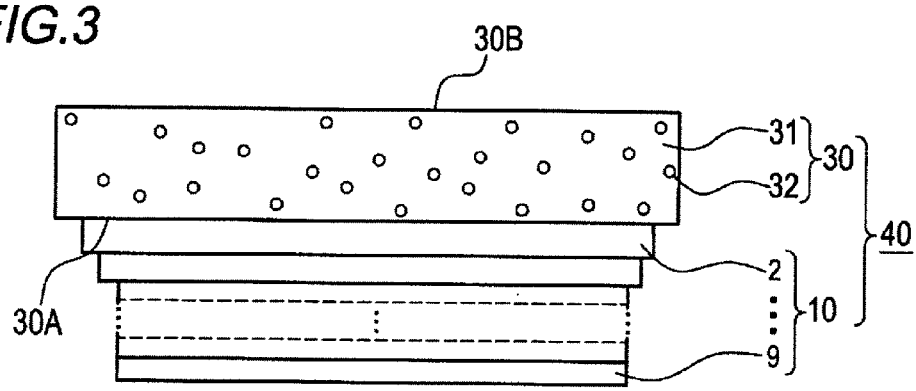
FIG. 3 is a schematic diagram showing one example of an illumination apparatus relating to the invention.

The illumination apparatus 40 according to an embodiment of the present invention contains, as shown in FIG. 3, the above-described organic electroluminescence device 10 and a light scattering member 30. More specifically, the illumination apparatus 40 is configured such that the substrate 2 of the organic electroluminescence device 10 and the light scattering member 30 are in contact with each other.

The light scattering member 30 is not particularly limited as long as it can scatter light, but in FIG. 3, a member obtained by dispersing fine particles 32 in a transparent substrate 31 is used. Suitable examples of the transparent substrate 31 include a glass substrate, and suitable examples of the fine particle 32 include a transparent resin fine particle. As the glass substrate and the transparent resin fine particle, a known product can be used for both. In such an illumination apparatus 40, when light emitted from the organic electroluminescence device 10 is incident on the light incident surface 30A of the scattering member 30, the incident light is scattered by the light scattering member and the scattered light is output as illuminating light from the light output surface 30B.

EXAMPLES

The invention will now be illustrated in more detail by reference to the following examples. The materials, the reagents, the ingredient contents and the proportions thereof, the operations and so on adopted in the following examples can be changed or modified as appropriate without departing from the spirit and scope of the invention. The scope of the invention therefore should not be construed as being limited to the following examples.

Example 1

A glass substrate having a deposition layer of iridium tin oxide (abbreviated as ITO) (manufactured by GEOMATEC Corporation, surface resistance: 10 Ω/sq., size: 0.5 mm thickness, 2.5 by 2.5 centimeters square) was placed in a cleaning vessel, and subjected to ultrasonic cleaning in 2-propanol. Then, UV-ozone treatment was given to the cleaned substrate for 30 minutes. On the thus obtained transparent anode, the following layers were provided in succession by use of a spraying method. In the formation of each layer, the carrier gas ($N_2$) quantity of an aerosol used and the size of liquid particles in the aerosol were adjusted to 1 L/min and 1 μm, respectively.

(1) Hole transporting layer (40 nm): By using the spraying method, poly(3,4-ethylenedioxythiophene)poly(styrenesulfonate) (PEDOT:PSS) (1 mass % aqueous dispersion liquid, AI4083, manufactured by Bayer AG, mass-average molecular weight: 10,000) was coated on the transparent anode in an amount to give a thickness of 40 nm to a hole transporting layer obtained, and then subjected to 1.5-hour vacuum drying at 150° C.

(2) First light emitting layer (Blue light emitting layer) (10 nm): By using the spraying method, a toluene solution containing CBP and Firpic at a ratio of 85:15 by mass (solids concentration: 0.1 mass %) was coated on the hole transporting layer in an amount to give a thickness of 10 nm to a first light emitting layer obtained, and then subjected to 10-minute vacuum drying at 100° C.

(3) Second light emitting layer (Green light emitting layer) (10 nm): By using the spraying method, a toluene solution containing CBP and Ir(ppy)$_3$ at a ratio of 95:5 by mass (solids concentration: 0.1 mass %) was coated on the first light emitting layer in an amount to give a thickness of 10 nm to a second light emitting layer obtained, and then subjected to 10-minute vacuum drying at 100° C.

(4) Third light emitting layer (Red light emitting layer) (10 nm): By using the spraying method, a toluene solution containing CBP and Btp$_2$Ir(acac) at a ratio of 95:5 by mass (solids concentration: 0.1 mass %) was coated on the second light emitting layer in an amount to give a thickness of 10 nm to a third light emitting layer obtained, and then subjected to 10-minute vacuum drying at 100° C.

(5) Hole blocking layer (15 nm): By using a vacuum deposition method, Balq was formed into a film on the third light emitting layer in an amount to give a thickness of 15 nm to a hole blocking layer obtained.

(6) Electron transporting layer (20 nm): By using a vacuum deposition method, Alq was formed into a film on the hole blocking layer in an amount to give a thickness of 20 nm to an electron transporting layer obtained.

(7) Electron injection layer (1 nm): By using a vacuum deposition method, lithium fluoride (LiF) was deposited on the electron transporting layer in an amount to give a thickness of 1 nm to an electron injection layer obtained.

(8) Cathode (100 nm): By using a vacuum deposition method, aluminum (Al) was deposited on the electron injection layer in an amount to give a thickness of 100 nm to a cathode obtained.

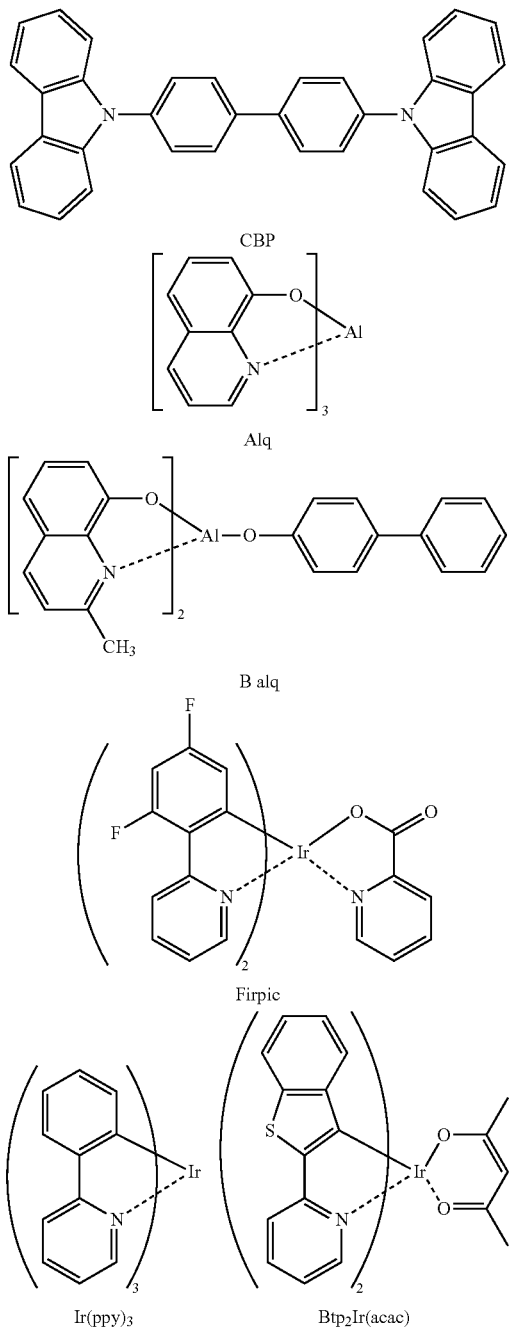

The thus made laminate was placed in a glove box having undergone substitution of argon for its internal air, and sealed by using a stainless-steel seal can and a UV-curable adhesive (XNR5516, manufactured by Nagase Chemtex Corporation), thereby making an organic EL device of Example 1 wherein the hole transporting layer, the first light emitting layer, the second light emitting layer and the third light emitting layer were each formed in film according to the spraying method.

Example 2

By carrying out the same procedure as in Example 1, except that the first light emitting layer was formed in the following step, an organic EL device of Example 2 was made wherein each of the hole transporting layer, the second light emitting layer and the third light emitting layer was formed in film according to the spraying method and the first light emitting layer was formed in film according to a deposition method.
(2) First light emitting layer (Blue light emitting layer) (10 nm): By using a vacuum deposition method, CBP and Firpic were deposited on the hole transporting layer in amounts to have a ratio of 85:15 by mass and give a thickness of 10 nm to a first light emitting layer obtained.

Example 3

By carrying out the same procedure as in Example 1, except that the first light emitting layer and the second light emitting layer were formed in the following steps, an organic EL device of Example 3 was made wherein each of the hole transporting layer and the third light emitting layer was formed in film according to the spraying method and each of the first light emitting layer and the second light emitting layer was formed in film according to a deposition method.
(2) First light emitting layer (Blue light emitting layer) (10 nm): By using a vacuum deposition method, CBP and Firpic were deposited on the hole transporting layer in amounts to have a ratio of 85:15 by mass and give a thickness of 10 nm to a first light emitting layer obtained.
(3) Second light emitting layer (Green light emitting layer) (10 nm): By using a vacuum deposition method, CBP and Ir(ppy)$_3$ were deposited on the first light emitting layer in amounts to have a ratio of 95:5 by mass and give a thickness of 10 nm to a second light emitting layer obtained.

Example 4

By carrying out the same procedure as in Example 1, except that the first light emitting layer was formed in the following step, an organic EL device of Example 4 was made wherein each of the hole transporting layer, the second light emitting layer and the third light emitting layer was formed in film according to the spraying method and the first light emitting layer was formed in film according to a spin coating method.
(2) First light emitting layer (Blue light emitting layer) (10 nm): By using a spin coating method, a toluene solution containing CBP and Firpic at a ratio of 85:15 by mass (solids concentration: 0.5 mass %) was coated on the hole transporting layer in an amount to give a thickness of 10 nm to a first light emitting layer obtained, and then subjected to 1-hour vacuum drying at 100° C.

Comparative Example 1

An organic EL device of Comparative Example 1 was made by carrying out the same procedure as in Example 1, except that the first to the third light emitting layers were replaced with the following single light emitting layer.
(4) Light emitting layer (30 nm): By using a spin coating method, a toluene solution containing CBP, Firpic, Ir(ppy)$_3$ and Btp$_2$Ir(acac) at a ratio of 86.95:12:0.7:0.35 by mass (solids concentration: 0.5 mass %) was coated on the hole transporting layer in an amount to give a thickness of 30 nm to a light emitting layer obtained, and then subjected to 1-hour vacuum drying at 100° C. The hole blocking layer was formed on the light emitting layer.

Comparative Example 2

By carrying out the same procedure as in Example 1, except that the first to third light emitting layers were formed in the following steps, an organic EL device of Comparative Example 2 was made wherein each of the first light emitting layer, the second light emitting layer and the third light emitting layer was formed in film according to a deposition method.
(2) First light emitting layer (Blue light emitting layer) (10 nm): By using a vacuum deposition method, CBP and Firpic were deposited on the hole transporting layer in amounts to have a ratio of 85:15 by mass and give a thickness of 10 nm to a first light emitting layer obtained.
(3) Second light emitting layer (Green light emitting layer) (10 nm): By using a vacuum deposition method, CBP and Ir(ppy)$_3$ were deposited on the first light emitting layer in amounts to have a ratio of 95:5 by mass and give a thickness of 10 nm to a second light emitting layer obtained.
(4) Third light emitting layer (Red light emitting layer) (10 nm): By using a vacuum deposition method, CBP and Btp$_2$Ir (acac) were deposited on the second light emitting layer in amounts to have a ratio of 95:5 by mass and give a thickness of 10 nm to a third light emitting layer obtained.

Comparative Example 3

By carrying out the same procedure as in Example 1, except that the first to third light emitting layers were formed in the following steps, an organic EL device of Comparative Example 3 was made wherein each of the first light emitting layer, the second light emitting layer and the third light emitting layer was formed in film according to a spin coating method.
(2) First light emitting layer (Blue light emitting layer) (10 nm): By using a spin coating method, a toluene solution containing CBP and Firpic at a ratio of 85:15 by mass (solids concentration: 0.5 mass %) was coated on the hole transporting layer in an amount to give a thickness of 10 nm to a first light emitting layer obtained, and then subjected to 1-hour vacuum drying at 100° C.
(3) Second light emitting layer (Green light emitting layer) (10 nm): By using a spin coating method, a toluene solution containing CBP and Ir(ppy)$_3$ at a ratio of 95:5 by mass (solids concentration: 0.5 mass %) was coated on the first light emitting layer in an amount to give a thickness of 10 nm to a second light emitting layer obtained, and then subjected to 1-hour vacuum drying at 100° C.
(4) Third light emitting layer (Red light emitting layer) (10 nm): By using a spin coating method, a toluene solution containing CBP and Btp$_2$Ir(acac) at a ratio of 95:5 by mass (solids concentration: 0.5 mass %) was coated on the second light emitting layer in an amount to give a thickness of 10 nm to a third light emitting layer obtained, and then subjected to 1-hour vacuum drying at 100° C.

(Evaluation of Organic EL Device)

Each of the thus obtained organic EL devices of Examples and Comparative Examples was evaluated by the following criteria. Evaluation results obtained are shown in Table 1.

<Luminous Efficiency>

Each of the organic EL devices made in the foregoing manners was made to emit light with a luminance of 1,000 cd/m² by applying thereto a direct-current voltage by means of a source measure unit Model 2400 manufactured by KEITHLEY Instruments Inc. Its emission spectrum and light quantity were measured with a luminance meter SR-3 manufactured by TOPCON CORPORATION, and its external quantum efficiency was calculated from the emission spectrum, the light quantity and the electric current at the time of measurement.

<Drive Voltage>

Direct-current voltage was applied to each of the organic EL devices made in the foregoing manners by means of a source measure unit Model 2400 manufactured by KEITHLEY Instruments Inc., and the voltage under which the luminance of light emitted reached to 1,000 cd/m² was adopted as a criterion for evaluating the drive voltage.

<Durability>

A continuous drive test was conducted on each of the organic EL devices made in the foregoing manners under a condition that the direct-current voltage for providing the initial luminance of 1,000 cd/m² was kept applying to the device by means of a source measure unit Model 2400 manufactured by KEITHLEY Instruments Inc., and the time required for the luminance to be reduced in half (the time elapsing before the illuminance reached 500 cd/m²) was determined as an endurance time.

<Color Reproducibility>

Each of the organic EL devices made in the foregoing manners was made to emit light with a luminance of 1,000 cd/m² by applying thereto direct-current voltage by means of a source measure unit Model 2400 manufactured by KEITHLEY Instruments Inc. CIE chromaticity of the light emitted was measured with a luminance meter SR-3 manufactured by TOPCON CORPORATION. The CIE chromaticity (x, y) nearer CIE chromaticity (x, y)=0.33:0.33 means that the color of light emitted is so nearer the desired color (white).

TABLE 1

| | Luminous efficiency (Cd/A) | Drive voltage (V) | Endurance time (hour) | CIE Chromaticity (x, y) |
|---|---|---|---|---|
| Example 1 | 25.6 | 6.7 | 2,300 | 0.37, 0.38 |
| Example 2 | 24.3 | 7.1 | 2,200 | 0.37, 0.39 |
| Example 3 | 22.1 | 7.1 | 2,000 | 0.37, 0.39 |
| Example 4 | 21.9 | 7.2 | 1,900 | 0.37, 0.39 |
| Comparative Example 1 | 14.3 | 7.8 | 850 | 0.35, 0.45 |
| Comparative Example 2 | 19.5 | 8.0 | 1,500 | 0.37, 0.39 |
| Comparative Example 3 | 5.4 | 12.7 | 480 | 0.42, 0.45 |

As to each of the organic EL devices made in Examples 1 to 4, because at least one of its multiple light emitting layers was formed by coating the liquid containing ingredients to constitute such a light emitting layer in a state of solution or dispersion in an organic solvent through the use of the spraying method, not only the manufacturing costs were reduced, but also the drive voltage was low. Further, where the luminous efficiency, the durability and the color reproducibility were concerned too, good results were obtained. The organic EL device of Example 1 in particular wherein all the multiple light emitting layers were formed by the spray coating method achieved very good results in the way of all the evaluation items.

By contrast, in the organic EL device of Comparative Example 1, a plurality of light emitting materials were incorporated into one and the same layer and performance capabilities thereof canceled one another out. Thus the device of Comparative Example 1 was inferior to the devices of Examples 1 to 4 in luminous efficiency, durability and color reproducibility.

The organic EL device of Comparative Example 2 was made by incorporating a plurality of light emitting materials into separate layers through the use of a vapor deposition method. Therefore it had improvement in color reproducibility, and besides its luminous efficiency and durability were somewhat improved, as compared with the device of Comparative Example 1. As to the drive voltage, however, the device of Comparative Example 2 was on the same level with the device of Comparative Example 1.

In Comparative Example 3, the multiple light emitting layers were all formed by a spin coating method, and it is thought that the spin coating method caused mixing in each light emitting layer, and therefore the luminous efficiency was low and the drive voltage was high. In addition, the durability of the device was very poor. And further the chromaticity was bad and the color of light emitted was yellow.

Example 5

On the same transparent anode as used in Example 1, the following layers were provided in succession by use of a spraying method. In the formation of each layer, the carrier gas ($N_2$) quantity (spray speed) of an aerosol used and the size of liquid particles in the aerosol were adjusted to 1 L/min and 1 μm respectively.

(1) Hole transporting layer (40 nm): By using the spraying method, a chlorobenzene solution containing a hole transporting material 1 and F4-TCNQ at a ratio of 99:1 by mass (solids concentration: 1 mass %) was coated on the transparent anode in an amount to give a thickness of 40 nm to a hole transporting layer obtained, and then subjected to 10-minute vacuum drying at 150° C.

(2) First light emitting layer (Blue light emitting layer) (10 nm): By using the spraying method, a toluene solution containing a host material 1 and a light emitting material 1 at a ratio of 85:15 by mass (solids concentration: 0.1 mass %) was coated on the hole transporting layer in an amount to give a thickness of 10 nm to a first light emitting layer obtained, and then subjected to 10-minute vacuum drying at 100° C.

(3) Second light emitting layer (Green light emitting layer) (10 nm): By using the spraying method, a toluene solution containing a host material 1 and a light emitting material 2 at a ratio of 93:7 by mass (solids concentration: 0.1 mass %) was coated on the first light emitting layer in an amount to give a thickness of 10 nm to a second light emitting layer obtained, and then subjected to 10-minute vacuum drying at 100° C.

(4) Third light emitting layer (Red light emitting layer) (10 nm): By using the spraying method, a toluene solution containing a host material 1 and a light emitting material 3 at a ratio of 95:5 by mass (solids concentration: 0.1 mass %) was coated on the second light emitting layer in an amount to give a thickness of 10 nm to a third light emitting layer obtained, and then subjected to 10-minute vacuum drying at 100° C.

(5) Electron transporting layer (40 nm): By using the spraying method, a n-butanol solution containing an electron transporting material 1 (solid concentration: 1 mass %) was coated on the third light emitting layer in an amount to give a thickness of 40 nm to an electron transporting layer obtained, and then subjected to 10-minute vacuum drying at 100° C.

(6) Electron injection layer (1 nm): By using a vacuum deposition method, lithium fluoride (LiF) was deposited on the electron transporting layer in an amount to give a thickness of 1 nm to an electron injection layer obtained.

(7) Cathode (100 nm): By using a vacuum deposition method, aluminum (Al) was deposited on the electron injection layer in an amount to give a thickness of 100 nm to a cathode obtained.

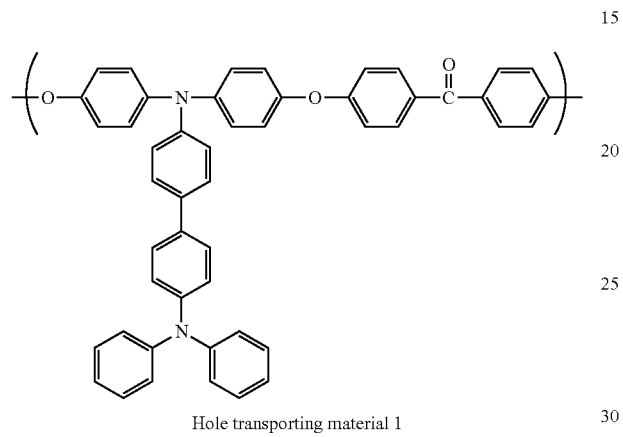

Hole transporting material 1

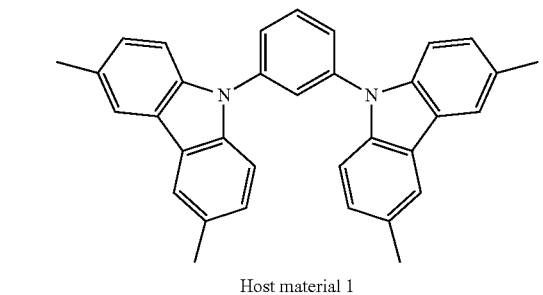

Host material 1

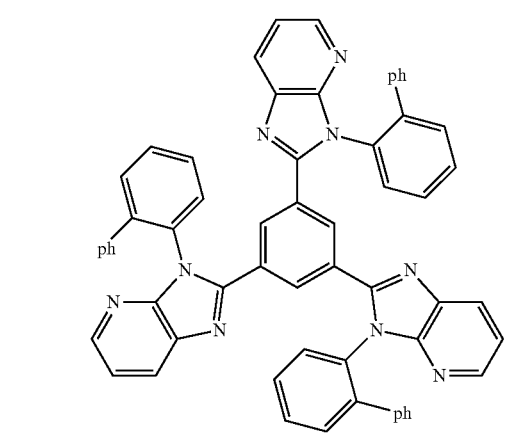

ph: phenyl group

Electron transporting material 1

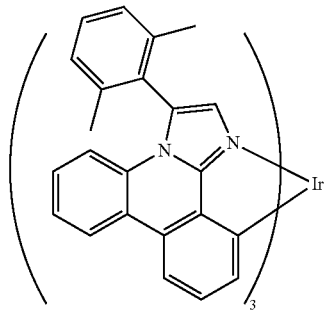

Light emitting material 1

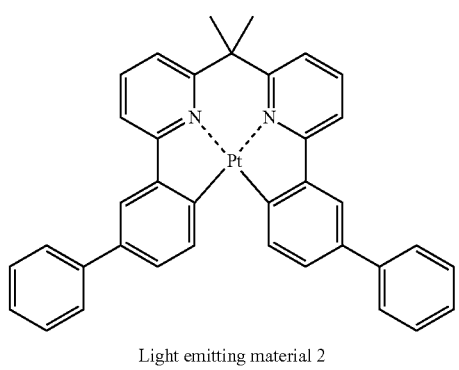

Light emitting material 2

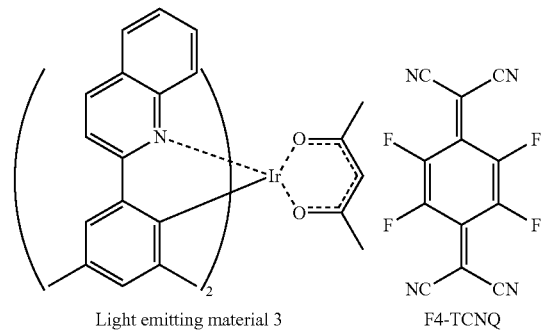

Light emitting material 3          F4-TCNQ

The thus made laminate was placed in a glove box having undergone substitution of argon for its internal air, and sealed by using a stainless-steel seal can and a UV-curable adhesive (XNR5516, manufactured by Nagase Chemtex Corporation), thereby making an organic EL device of Example 5.

Comparative Example 4

An organic EL device of Comparative Example 4 was made by carrying out the same procedure as in Example 5, except that the first to the third light emitting layers were replaced with the following single light emitting layer.

(4) Light emitting layer (30 nm): By using a spin coating method, a toluene solution containing the host material 1, the light emitting material 1, the light emitting material 2 and the light emitting material 3 at a mass ratio of 83.5:15:1:0.5 (solids concentration: 0.5 mass %) was coated on the hole transporting layer in an amount to give a thickness of 30 nm to a light emitting layer obtained, and then subjected to 1-hour vacuum drying at 100° C. Incidentally, the electron transporting layer was formed on this light emitting layer.

Comparative Example 5

By carrying out the same procedure as in Example 5, except that the first to third light emitting layers and the electron transporting layer were formed in the following steps, an organic EL device of Comparative Example 5 was made.

(2) First light emitting layer (Blue light emitting layer) (10 nm): By using a vacuum deposition method, the host material 1 and the light emitting material 1 were deposited on the hole transporting layer in amounts to have a ratio of 85:15 by mass and give a thickness of 10 nm to a first light emitting layer obtained.

(3) Second light emitting layer (Green light emitting layer) (10 nm): By using a vacuum deposition method, the host material 1 and the light emitting material 2 were deposited on the first light emitting layer in amounts to have a ratio of 93:7 by mass and give a thickness of 10 nm to a second light emitting layer obtained.

(4) Third light emitting layer (Red light emitting layer) (10 nm): By using a vacuum deposition method, the host material 1 and the light emitting material 3 were deposited on the second light emitting layer in amounts to have a ratio of 95:5 by mass and give a thickness of 10 nm to a third light emitting layer obtained.

(5) Electron transporting layer (40 nm): By using a vacuum deposition method, the electron transporting material 1 was deposited on the third light emitting layer in an amount to give a thickness of 40 nm to an electron transporting layer obtained.

(Evaluation of Organic EL Device)

Each of the thus obtained organic EL devices of Example and Comparative Examples was evaluated by the same criteria as defined hereinbefore. Evaluation results obtained are shown in Table 2.

TABLE 2

|  | Luminous efficiency (Cd/A) | Drive voltage (V) | Endurance time (hour) | CIE Chromaticity (x, y) |
|---|---|---|---|---|
| Example 5 | 38.7 | 5.6 | 4,800 | 0.36, 0.38 |
| Comparative Example 4 | 19.4 | 6.9 | 2,300 | 0.39, 0.39 |
| Comparative Example 5 | 28.6 | 7.2 | 3,500 | 0.36, 0.39 |

As to the organic EL devices made in Examples 5, because the multiple light emitting layers and the electron transporting layer were each formed by coating the liquid containing ingredients to constitute each of such layers in a state of solution or dispersion in the organic solvent through the use of the spraying method, not only the manufacturing costs were reduced, but also the drive voltage was low. Further, where the luminous efficiency, the durability and the color reproducibility were concerned too, very good results were obtained.

By contrast, in the organic EL device of Comparative Example 4, a plurality of light emitting materials were incorporated into one and the same layer and performance capabilities thereof canceled one another out, and therefore the device of Comparative Example 4 was inferior to the device of Example 5 in luminous efficiency, durability and color reproducibility.

The organic EL device of Comparative Example 5 was made by incorporating a plurality of light emitting materials into separate layers through the use of a vapor deposition method and forming the electron transporting layer also through the use of a vapor deposition method, and therefore had somewhat improved luminous efficiency and durability as compared with the device of Comparative Example 4, but the drive voltage thereof was on the same level with that of the device of Comparative Example 4.

Example 6

An organic EL device of Example 6 was made by carrying out the same procedure as in Example 5, except that the second and third light emitting layers were replaced with the following single second light emitting layer.

(3) Second light emitting layer (Orange light emitting layer) (20 nm): By using the spraying method, a toluene solution containing the host material 1, the light emitting material 2 and the light emitting material 3 at a ratio of 92:7:1 by mass (solids concentration: 0.1 mass %) was coated on the first light emitting layer in an amount to give a thickness of 20 nm to a second light emitting layer obtained, and then subjected to 10-minute vacuum drying at 100° C. Incidentally, the electron transporting layer was formed on this second light emitting layer.

Comparative Example 6

By carrying out the same procedure as in Example 6, except that the first and second light emitting layers and the electron transporting layer were formed in the following steps, an organic EL device of Comparative Example 6 was made.

(2) First light emitting layer (Blue light emitting layer) (10 nm): By using a vacuum deposition method, the host material 1 and the light emitting material 1 were deposited on the hole transporting layer in amounts to have a ratio of 85:15 by mass and give a thickness of 10 nm to a first light emitting layer obtained.

(3) Second light emitting layer (Orange light emitting layer) (20 nm): By using a vacuum deposition method, the host material 1, the light emitting material 2 and the light emitting material 3 were deposited on the first light emitting layer in amounts to have a ratio of 92:7:1 by mass and give a thickness of 10 nm to a second light emitting layer obtained.

(5) Electron transporting layer (40 nm): By using a vacuum deposition method, the electron transporting material 1 was deposited on the second light emitting layer in an amount to give a thickness of 40 nm to an electron transporting layer obtained.

(Evaluation of Organic EL Device)

Each of the thus obtained organic EL devices of Example and Comparative Example was evaluated by the same criteria as defined hereinbefore. Evaluation results obtained are shown in Table 3.

TABLE 3

|  | Luminous efficiency (Cd/A) | Drive voltage (V) | Endurance time (hour) | CIE Chromaticity (x, y) |
|---|---|---|---|---|
| Example 6 | 40.2 | 5.5 | 5,300 | 0.36, 0.36 |
| Comparative Example 6 | 31.8 | 6.3 | 3,800 | 0.36, 0.39 |

As to the organic EL device made in Examples 6, because the multiple light emitting layers and the electron transporting layer were each formed by coating the liquid containing ingredients to constitute each of such layers in a state of solution or dispersion in the organic solvent through the use of the spraying method, not only the manufacturing costs were reduced, but also the drive voltage was low. Further, where the luminous efficiency, the durability and the color reproducibility were concerned too, very good results were obtained.

On the other hand, the organic EL device of Comparative Example 6 was made from the light emitting materials and the electron transporting layer through the use of vapor deposition, and its results as to luminous efficiency, drive voltage and durability were inferior to the results attained in Example 6 with respect to such items.

Example 7

An organic EL device of Example 7 was made by carrying out the same procedure as in Example 5, except that the second light emitting layer and the third light emitting layer in Example 5 were replaced with the following second light emitting layer and third emitting layer, respectively.

(3) Second light emitting layer (Orange light emitting layer) (10 nm): By using the spraying method, a toluene solution containing the host material 1, the light emitting material 2 and the light emitting material 3 at a ratio of 92:7:1 by mass (solids concentration: 0.1 mass %) was coated on the first light emitting layer in an amount to give a thickness of 10 nm to a second light emitting layer obtained, and then subjected to 10-minute vacuum drying at 100° C.

(4) Third light emitting layer (Blue light emitting layer) (10 nm): By using the spraying method, a toluene solution containing the host material 1 and the light emitting material 1 at a ratio of 85:15 by mass (solids concentration: 0.1 mass %) was coated on the second light emitting layer in an amount to give a thickness of 10 nm to a third light emitting layer obtained, and then subjected to 10-minute vacuum drying at 100° C.

Comparative Example 7

By carrying out the same procedure as in Example 7, except that the first to third light emitting layers and the electron transporting layer were formed in the following steps, an organic EL device of Comparative Example 7 was made.

(2) First light emitting layer (Blue light emitting layer) (10 nm): By using a vacuum deposition method, the host material 1 and the light emitting material 1 were deposited on the hole transporting layer in amounts to have a ratio of 85:15 by mass and give a thickness of 10 nm to a first light emitting layer obtained.

(3) Second light emitting layer (Orange light emitting layer) (10 nm): By using a vacuum deposition method, the host material 1, the light emitting material 2 and the light emitting material 3 were deposited on the first light emitting layer in amounts to have a ratio of 92:7:1 by mass and give a thickness of 10 nm to a second light emitting layer obtained.

(4) Third light emitting layer (Blue light emitting layer) (10 nm): By using a vapor deposition method, the host material 1 and the light emitting material 1 were deposited on the second light emitting layer in amounts to have a ratio of 85:15 by mass and give a thickness of 10 nm to a third light emitting layer obtained.

(5) Electron transporting layer (40 nm): By using a vapor deposition method, the electron transporting material 1 was deposited on the third light emitting layer in an amount to give a thickness of 40 nm to an electron transporting layer obtained.

(Evaluation of Organic EL Device)

Each of the thus obtained organic EL devices of Example and Comparative Example was evaluated by the same criteria as defined hereinbefore. Evaluation results obtained are shown in Table 4.

TABLE 4

|  | Luminous efficiency (Cd/A) | Drive voltage (V) | Endurance time (hour) | CIE Chromaticity (x, y) |
| --- | --- | --- | --- | --- |
| Example 7 | 41.5 | 5.5 | 6,200 | 0.33, 0.32 |
| Comparative Example 7 | 34.6 | 6.7 | 4,100 | 0.33, 0.39 |

As to the organic EL devices made in Examples 7, because the multiple light emitting layers and the electron transporting layer were each formed by coating the liquid containing ingredients to constitute each of such layers in a state of solution or dispersion in the organic solvent through the use of the spraying method, not only the manufacturing costs were reduced, but also the drive voltage was low. Further, where the luminous efficiency, the durability and the color reproducibility were concerned too, very good results were obtained.

On the other hand, the organic EL device of Comparative Example 7 was made from the light emitting materials and the electron transporting layer through the use of vapor deposition, and its results as to luminous efficiency, drive voltage and durability were inferior to the results attained in Example 7 with respect to such items.

Example 8

An organic EL device of Example 8 was made by carrying out the same procedure as in Example 1, except that the hole transporting layer and the first to third light emitting layers were formed in the following steps. Additionally, in the formation of each layer according to spray coating, the carrier gas ($N_2$) quantity (spray speed) of an aerosol used and the size of liquid particles in the aerosol were adjusted to 1 L/min and 1 μm, respectively, as in Example 1.

(1) Hole transporting layer (40 nm): By using the spraying method, a chlorobenzene solution containing PTPDES and F4-TCNQ at a ratio of 98:2 by mass (solids concentration: 1 mass %) was coated on the transparent anode in an amount to give a thickness of 40 nm to a hole transporting layer obtained, and then subjected to 10-minute vacuum drying at 150° C.

(2) to (4) First to third light emitting Layers (10 nm each): First to third light emitting layers were formed in the same steps as those in Example 5, respectively.

Example 9

By carrying out the same procedure as in Example 8, except that the third light emitting layer was formed in the following step, an organic EL device of Example 9 was made wherein each of the hole transporting layer, the first light emitting layer and the second light emitting layer was formed in film according to the spraying method and the third light emitting layer was formed in film according to a deposition method.

(4) Third light emitting layer (Red light emitting layer) (10 nm): By using a vapor deposition method, the host material Balq and the light emitting material 4 were deposited on the second light emitting layer in amounts to have a ratio of 95:5 by mass and give a thickness of 10 nm to a third light emitting layer obtained.

Example 10

By carrying out the same procedure as in Example 8, except that the second light emitting layer and the third light emitting layer were formed in the following steps, an organic EL device of Example 10 was made wherein each of the hole transporting layer and the first light emitting layer was formed in film according to the spraying method and each of the second light emitting layer and the third light emitting layer was formed in film according to a deposition method.
(3) Second light emitting layer (Green light emitting layer) (10 nm): By using a vapor deposition method, the host material 1 and the light emitting material 2 were deposited on the first light emitting layer in amounts to have a ratio of 93:7 by mass and give a thickness of 10 nm to a second light emitting layer obtained.
(4) Third light emitting layer (Red light emitting layer) (10 nm): By using a vapor deposition method, the host material Balq and the light emitting material 4 were deposited on the second light emitting layer in amounts to have a ratio of 95:5 by mass and give a thickness of 10 nm to a third light emitting layer obtained.

Comparative Example 8

By carrying out the same procedure as in Example 8, except that the first to third light emitting layers were formed in the same steps in Comparative Example 5, an organic EL device of Comparative Example 8 was made wherein each of the first light emitting layer, the second light emitting layer and the third light emitting layer was formed in film according to the deposition method.

Comparative Example 9

By carrying out the same procedure as in Example 8, except that the first to third light emitting layers were formed in the following steps, an organic EL device of Comparative Example 9 was made wherein each of the first light emitting layer, the second light emitting layer and the third light emitting layer was formed in film according to a spin coating method.
(2) First light emitting layer (Blue light emitting layer) (10 nm): By using a spin coating method, a toluene solution containing the host material 1 and the light emitting material 1 at a ratio of 85:15 by mass (solids concentration: 0.5 mass %) was coated on the hole transporting layer in an amount to give a thickness of 10 nm to a first light emitting layer obtained, and then subjected to 1-hour vacuum drying at 100° C.
(3) Second light emitting layer (Green light emitting layer) (10 nm): By using a spin coating method, a toluene solution containing the host material 1 and the light emitting material 2 at a ratio of 93:7 by mass (solids concentration: 0.5 mass %) was coated on the first light emitting layer in an amount to give a thickness of 10 nm to a second light emitting layer obtained, and then subjected to 1-hour vacuum drying at 100° C.
(4) Third light emitting layer (Red light emitting layer) (10 nm): By using a spin coating method, a toluene solution containing the host material Balq and the light emitting material 4 at a ratio of 95:5 by mass (solids concentration: 0.5 mass %) was coated on the second light emitting layer in an amount to give a thickness of 10 nm to a third light emitting layer obtained, and then subjected to 1-hour vacuum drying at 100° C.

Example 11

An organic EL device of Example 11 was made by carrying out the same procedure as in Example 8, except that the first light emitting layer was formed in the following step.
First light emitting layer (Blue light emitting layer) (10 nm): By using the spraying method, a toluene solution containing CBP as a host material and a light emitting material 5 acting as fluorescent material at a ratio of 95:5 by mass (solids concentration: 0.1 mass %) was coated on the hole transporting layer in an amount to give a thickness of 10 nm to a first light emitting layer obtained, and then subjected to 10-minute vacuum drying at 100° C.

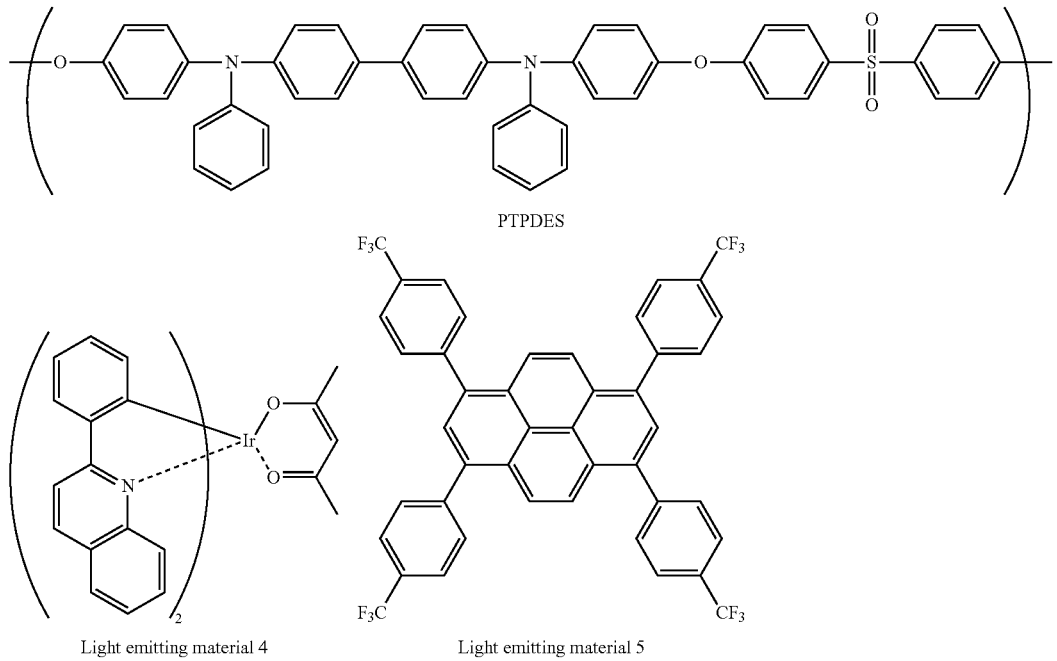

PTPDES

Light emitting material 4    Light emitting material 5

(Evaluation of Organic EL Device)

Each of the thus obtained organic EL devices of Examples and Comparative Examples was evaluated by the same criteria as defined hereinbefore. Evaluation results obtained are shown in Table 5.

TABLE 5

|  | Luminous efficiency (Cd/A) | Drive voltage (V) | Endurance time (hour) | CIE Chromaticity (x, y) |
| --- | --- | --- | --- | --- |
| Example 8 | 38.7 | 6.1 | 5,100 | 0.37, 0.37 |
| Example 9 | 34.2 | 6.9 | 4,200 | 0.37, 0.37 |
| Example 10 | 30.7 | 7.4 | 3,800 | 0.37, 0.37 |
| Example 11 | 21.2 | 8.1 | 3,200 | 0.34, 0.35 |
| Comparative Example 8 | 19.9 | 11.2 | 3,000 | 0.37, 0.38 |
| Comparative Example 9 | 4.8 | 13.2 | 350 | 0.43, 0.45 |

As to each of the organic EL devices made in Examples 8 to 10, because at least one of its multiple light emitting layers was formed by coating the liquid containing ingredients to constitute such a light emitting layer in a state of solution or dispersion in the organic solvent through the use of the spraying method, not only the manufacturing costs were reduced, but also the drive voltage was low. Further, where the luminous efficiency, the durability and the color reproducibility were concerned too, good results were obtained. The organic EL device of Example 8 in particular wherein all the multiple light emitting layers were formed by spray coating achieved very good results in the way of all the evaluation items.

On the other hand, the organic EL device of Comparative Example 8 was made by forming each of its light emitting layers and electron transporting layer through the use of the vapor deposition method, and the results obtained with respect to luminous efficiency, drive voltage and durability were inferior to the results attained in each of Examples 8 to 10.

Further, as to the organic EL device of Comparative Example 9, its three light emitting layers were formed by spin coating, and therefore dissolution and mixing occurred in each of the layers. Thus, the results obtained were vastly inferior to those attained in each of Examples 8 to 10 with respect to any of evaluation items, luminous efficiency, drive voltage and durability.

The organic EL device of Example 11 differed from the organic EL device of Example 8 in that its first light emitting layer was formed by using the fluorescent material as a blue light emitting material and coating it in accordance with the spraying method; as a result, it had low luminous efficiency as compared with the organic EL device of Example 8. However, it was ascertained that light emission from the device of Example 11 was satisfactory.

While the present invention has been shown and described with reference to certain exemplary embodiments thereof, it will be understood by those skilled in the art that various changes modifications may be made therein without departing from the spirit and scope of the present invention as defined by the appended claims.

What is claimed is:

1. An organic electroluminescence device, comprising: a pair of electrodes; and an organic layer containing multiple light emitting layers provided between the pair of electrodes, wherein at least one of the multiple light emitting layers comprises ingredients capable of forming an aerosol of said ingredients, wherein said ingredients being dispersed or dissolved in an organic solvent.

2. The organic electroluminescence device according to claim 1, wherein each of the multiple light emitting layers comprises ingredients capable of forming an aerosol of said ingredients, wherein said ingredients being dispersed or dissolved in an organic solvent.

3. The organic electroluminescence device according to claim 1, further comprising a hole transporting layer.

4. The organic electroluminescence device according to claim 1, further comprising an electron transporting layer.

5. The organic electroluminescence device according to claim 1, wherein each of the layers, other than the light emitting layer, comprises other ingredients capable of forming an aerosol of said ingredients, wherein said ingredients being dispersed or dissolved in an organic solvent.

6. The organic electroluminescence device according to claim 1, wherein each of the layers, other than the light emitting layer, comprises other ingredients capable of forming an aerosol of said ingredients, wherein said ingredients being dispersed or dissolved in an organic solvent.

7. The organic electroluminescence device according to claim 1, wherein the multiple light emitting layers include a first light emitting layer which emits light of a first emission color and a second light emitting layer which emits light of a second emission color different from the first emission color.

8. The organic electroluminescence device according to claim 1, wherein the multiple light emitting layers include a first light emitting layer which emits light of a first emission color, a second light emitting layer which emits light of a second emission color different from the first emission color and a third light emitting layer which emits light of a third emission color different from the first emission color and the second emission color.

9. The organic electroluminescence device according to claim 1, wherein the multiple light emitting layers contain different light emitting materials, respectively.

10. The organic electroluminescence device according to claim 1, wherein at least one of the multiple light emitting layers contains a phosphorescent material.

11. The organic electroluminescence device according to claim 1, which can emit white light.

12. A display apparatus which is equipped with the organic electroluminescence device according to claim 1.

13. An illumination apparatus which is equipped with the organic electroluminescence device according to claim 1.

* * * * *